US008427170B2

(12) United States Patent
Morimoto et al.

(10) Patent No.: US 8,427,170 B2

(45) Date of Patent: Apr. 23, 2013

(54) DRIVE CIRCUIT ARRAY SUBSTRATE AND PRODUCTION AND TEST METHODS THEREOF

(75) Inventors: Kazunori Morimoto, Sagamihara (JP); Tsuyoshi Ozaki, Fuchu (JP)

(73) Assignee: Casio Computer Co., Ltd., Tokyo (JP)

( * ) Notice: Subject to any disclaimer, the term of this patent is extended or adjusted under 35 U.S.C. 154(b) by 661 days.

(21) Appl. No.: 12/717,272

(22) Filed: Mar. 4, 2010

(65) Prior Publication Data

US 2010/0225770 A1 Sep. 9, 2010

(30) Foreign Application Priority Data

Mar. 5, 2009 (JP) ................................ 2009-052044
Mar. 24, 2009 (JP) ................................ 2009-071285
Dec. 25, 2009 (JP) ................................ 2009-296259

(51) Int. Cl.
*G01R 31/02* (2006.01)

(52) U.S. Cl.
USPC ............................ 324/537; 345/211; 348/189

(58) Field of Classification Search .................. 345/211; 348/189; 324/537
See application file for complete search history.

(56) References Cited

U.S. PATENT DOCUMENTS 7,518,393 B2 4/2009 Shirasaki et al.
2003/0063081 A1* 4/2003 Kimura et al. ................ 345/211
2010/0053141 A1* 3/2010 Ishiguro et al. ............... 345/211

FOREIGN PATENT DOCUMENTS

JP 2001-195012 A 7/2001
JP 2005-285631 A 10/2005
JP 2008-242336 A 10/2008

OTHER PUBLICATIONS

Japanese Office Action dated Oct. 2, 2012 (and English translation thereof) in counterpart Japanese Application No. 2009-296259.

* cited by examiner

*Primary Examiner* — Jermele M Hollington
*Assistant Examiner* — Alesa Allgood
(74) *Attorney, Agent, or Firm* — Holtz, Holtz, Goodman & Chick, P.C.

(57) ABSTRACT

A drive circuit array substrate allowing for tests without mounting any driver ICs and without using expensive panel contact jigs and production and test methods thereof are provided. A data voltage application circuit, data selection circuit, gate selection circuit, and anode driver connected to a display pixel forming zone are formed on a drive circuit array substrate. The data voltage application circuit, data selection circuit, gate selection circuit, and anode driver allows for lighting test and aging test of the light emitting elements in the display pixel forming zone and measurement of transistor characteristics without mounting any driver ICs and without using expensive panel contract jigs.

10 Claims, 16 Drawing Sheets

DRIVE CIRCUIT ARRAY SUBSTRATE AND PRODUCTION AND TEST METHODS THEREOF

CROSS-REFERENCE TO RELATED APPLICATION

This application claims the benefit of Japanese Patent Application No. 2009-052044 filed Mar. 5, 2009, Japanese Patent Application No. 2009-071285 filed Mar. 24, 2009 and Japanese Patent Application No. 2009-296259 filed Dec. 25, 2009, the entire disclosure of which is incorporated by reference herein.

FIELD

This application relates generally to a drive circuit array substrate using organic EL (electroluminescence) elements and production and test methods thereof.

BACKGROUND

An organic EL element generally comprises an anode electrode and cathode electrode, and an electron-injection layer, light emission layer, and hole-injection layer formed between the electrodes. An organic EL element emits light using the energy generated when holes supplied from the hole-injection layer and electrons supplied from the electron-injection layer are recoupled in the light emission layer. Such EL elements are used as a display device as disclosed in Patent Literature 1. They are driven, for example, by TFTs (thin film transistors) provided thereto individually.

Such a display device is subject to aging or lighting test before shipment in which a testing apparatus is connected to their driver connection terminals on the panel via probes before or after the driver ICs (integrated circuits) are mounted (Patent Literature 1: Unexamined Japanese Patent Application KOKAI Publication No. 2001-195012).

If the aging or lighting test is conducted after the driver ICs are mounted as in the prior art and any defect is found, the device cannot be shipped as a finished product and the mounted driver ICs are wasted.

On the other hand, making the (several hundred) driver connection terminals on the panel fully contact with a testing device using probes before the driver ICs are mounted leads to high cost of the probes themselves. Additionally, the probes create a large load upon making contact with the panel (for example, 4 g per probe and several kg in total). A rigid contact jig is required and the jig itself becomes accordingly expensive.

Furthermore, the aging or lighting test can be conducted by simplified driving such as short-circuiting between the terminals before the driver ICs are mounted. In this way, some limitation may be imposed on the test items.

Therefore, there is a demand for a drive circuit array substrate allowing for tests without mounting all driver ICs and without using many expensive panel contact jigs, and production and test methods thereof.

The present invention is made in view of the above problems and the purpose of the present invention is to provide a drive circuit array substrate allowing for tests without mounting all driver ICs and without using many expensive panel contact jigs, and production and tests methods thereof.

SUMMARY

In order to achieve the above objective, the drive circuit array substrate according to the first aspect of the present invention includes:

a plurality of control signal wires formed on a substrate and extending in a first direction;

a plurality of gradation signal wires formed on the substrate and extending in a second direction that is different from the first direction;

a plurality of pixels formed on the substrate and arranged near the intersections of the control signal wires and the gradation signal wires; and a drive element test circuit formed on the substrate, wherein each of the pixels including a drive circuit, wherein the drive circuit includes a drive element and a selection element, wherein one end of a current path of the selection element is connected to one end of a current path of the drive element, and the other end of the current path of the selection element is connected to the gradation signal wire;

wherein the drive element test circuit includes a plurality of test wires connected to the gradation signal wires respectively, a feeder wire to which an external circuit having a voltage source or a current source is connected, a plurality of read switches of which a current path is connected to the test wire at one end and connected to the feeder wire at the other end, and a test wire selection circuit selecting the read switches in sequence;

wherein the feeder wire allows a current to run through the current path of the drive element from the external circuit via the selected read switch, the test wire, and the gradation signal wire when the feeder wire is connected to the external circuit.

It is preferable in the drive circuit array substrate that:

the pixels further comprise a light emitting element which emits light when the drive element is driven;

the drive circuit array substrate further comprises a light emitting element test circuit formed on the substrate;

the light emitting element test circuit comprises a plurality of first wires connected to the gradation signal wires respectively, a plurality of second wires connected to an external voltage source or connected to an external current source, a plurality of third wires connected to an external voltage source, and an output control switch formed in the same step as the drive element, the selection element of the drive circuit and the read switches and a current path of the output control switch is connected to the first wire at one end and connected to the second wire at the other end;

the second wire allows a current to run through the current path of the drive element from an external voltage source or from an external current source via the output control switch, the test wire, and the gradation signal wire so that the light emitting element emits light when the second wire is connected to the external voltage source or connected to the external current source, and the third wire is connected to the external voltage source.

It is preferable in the drive circuit array substrate that:

the second wire and the third wire are provided for each emitted light color of the light emitting element.

It is preferable in the drive circuit array substrate that:

a control signal supply circuit connected to the control signal wire and supplying control signals to the selection element is provided.

In order to achieve the above purpose, the drive circuit array substrate according to the second aspect of the present invention includes:

a plurality of control signal wires formed on a substrate and extending in a first direction;

a plurality of gradation signal wires formed on the substrate and extending in a second direction that is different from the first direction;

a plurality of pixels formed on the substrate, having a drive circuit having a drive element and a selection element of which a current path is connected to the gradation signal wire at one end and connected to a gate of the drive element at the other end, and a light emitting element which emits light when the drive element is driven, and arranged near the intersections between the control signal wires and the gradation signal wires;

a drive element test circuit formed on the substrate; and a light emitting element test circuit formed on the substrate;

wherein the drive element test circuit includes a plurality of test wires connected to a plurality of gradation signal wires respectively, a feeder wire to which an external circuit having a voltage source or a current source is connected, a plurality of read switches of which a current path is connected to the test wire at one end and connected to the feeder wire at the other end, and a test wire selection circuit selecting the read switches in sequence;

the light emitting element test circuit has a plurality of first wires connected to the gradation signal wires respectively, a plurality of second wires connected to an external voltage source or connected to an external current source, a plurality of third wires connected to an external voltage source, and an output control switch of which the current path is connected to the first wire at one end and connected to the second wire at the other end;

when the feeder wire is connected to the external circuit, a current is allowed to run through the current path of the drive element via the feeder wire, the selected read switch, the test wire, and the gradation signal wire;

when the second wire is connected to an external voltage source or connected to an external current source and the third wire is connected to an external voltage source, a current is allowed to run through the current path of the drive element via the second wire, the output control switch, the test wire, and the gradation signal wire so that the light emitting element emits light.

It is preferable in the drive circuit array substrate that:

a control signal supply circuit connected to the control signal wire and supplying control signals to the selection element is provided.

In order to achieve the above purpose, a method of producing a drive circuit array substrate according to the third aspect of the present invention comprises the steps of:

a wire formation step of forming on a substrate a plurality of control signal wires extending in a first direction and a plurality of gradation signal wires extending in a second direction that is different from the first direction;

a pixels formation step of forming on the substrate a plurality of pixels comprising a drive circuit having a drive element and a selection element of which the current path is connected to one end of the current path of the drive element at one end and connected to the gradation signal wire at the other end and arranged near the intersections between the control signal wires and the gradation signal wires;

a circuit formation step of forming a drive element test circuit having a plurality of test wires connected to the gradation signal wires respectively, a feeder wire to which an external circuit having a voltage source or a current source is connected, a plurality of read switches of which the current path is connected to the test wire at one end and connected to the feeder wire at the other end, and a test wire selection circuit selecting the read switches in sequence on the substrate along a side; and a step of allowing the feeder wire to run a current through the current path of the drive element from the external circuit via the selected read switch, the test wire, and the gradation signal wire after the wire formation, the pixel formation, and the circuit formation steps are completed and the feeder wire is connected to the external circuit.

It is preferable that the method of producing a drive circuit array substrate comprises:

a step of separating the drive element test circuit from the substrate on which the pixels are provided along a side of the substrate after the step of running a current.

It is preferable that the method of producing a drive circuit array substrate includes:

a driver formation step of forming a driver along another side of the substrate after the separation step.

It is preferable in the method of producing a drive circuit array substrate that:

the pixels further comprise a light emitting element which emits light when the drive element is driven and the pixel formation step includes a step of forming the light emitting element;

the circuit formation step includes a step of forming a light emitting element test circuit having a plurality of first wires connected to the a plurality of gradation signal wires respectively, a second wire connected to an external voltage source or connected to an external current source, a third wire connected to an external voltage source, and an output control switch formed in the same step as the drive element and the selection element of the drive circuit and the read switches and a current path of the output control switch is connected to the first wire at one end and connected to the second wire at the other end;

furthermore, when the second wire is connected to an external voltage source or connected to an external current source and the third wire is connected to an external voltage source, the second wire allows a current to run through the current path of the drive element from the external voltage source or from an external current source via the output control switch, the test wire, and the gradation signal wire so that the light emitting element emits light.

It is preferable that the method of producing a drive circuit array substrate comprises:

a step of separating the drive element test circuit and the light emitting element test circuit from the substrate on which the a plurality of pixels are provided after the step of running a current.

It is preferable that the method of producing a drive circuit array substrate includes:

a driver formation step of forming a driver along another side of the substrate after the separation step.

In order to achieve the above purpose, a method of testing a drive circuit array substrate according to the fourth aspect of the present invention is a method of testing a drive circuit array substrate including:

a plurality of control signal wires formed on the substrate and extending in a first direction;

a plurality of gradation signal wires formed on the substrate and extending in a second direction that is different from the first direction;

a plurality of pixels formed on the substrate and arranged near the intersections between the control signal wires and the gradation signal wires; and a drive element test circuit formed on the substrate, wherein each of the pixels has a drive circuit having a drive element and a selection element of which the current path is connected to one end of the current path of the drive element at one end and connected to the gradation signal wire at the other end; and the drive element test circuit has a plurality of test wires connected to the gradation signal wires respectively, a feeder wire to which an external circuit having a voltage source or a current source and a voltmeter or an ammeter is connected, a plurality of read switches of which the current path is connected to the test wire at one end and connected to the feeder wire at the other end, and a test wire selection circuit selecting the read switches in sequence;

and the method comprises:

a step of running a current through the current path of the drive element via the feeder wire, the selected read switch, the test wire, and the gradation signal wire when the feeder wire is connected to the external circuit; and a drive test step of measuring the element characteristics of the drive element either by supplying a voltage to the test wire and measuring the voltage value or by supplying a current to the test wire and measuring the voltage value so as to test the drive of the drive circuit.

It is preferable in the method of testing a drive circuit array substrate that:

the pixels further comprise a light emitting element which emits light when the drive element is driven;

the drive circuit array substrate further comprises a light emission test circuit formed on the substrate;

the light emitting element test circuit has a plurality of first wires connected to a plurality of gradation signal wires respectively, a second wire connected to an external voltage source or connected to an external current source, a third wire connected to an external voltage source, and an output control switch formed in the same step as the drive element and the selection element of the drive circuit and the read switches and the current path of the output control switch is connected to the first wire at one end and connected to the second wire at the other end;

the method includes:

a light emission test step in which when the second wire is connected to an external voltage source or connected an external current source and the third wire is connected to an external voltage source, the second wire allows a current to run through the current path of the drive element from the external voltage source or from the external current source via the output control switch, test wire, and the gradation signal wire so that the light emitting element emits light so as to examine whether an intended light emitting element emits light normally.

It is preferable in the method of testing a drive circuit array substrate that:

the second wire and the third wire are provided for each emitted light color of the light emitting element; and the light emission test step includes a test item of selecting the second wire and the third wire corresponding to each emitted light color and testing the light emitting elements by making the light emitting elements emit light at each intended color light.

It is preferably in the method of testing a drive circuit array substrate that:

the light emission test step includes a test item of making the light emitting elements emit light in a high temperature environment.

BRIEF DESCRIPTION OF THE DRAWINGS

A more complete understanding of this application can be obtained when the following detailed description is considered in conjunction with the following drawings, in which.

DETAILED DESCRIPTION

The methods of producing and testing a display device according to an embodiment of the present invention will be described hereafter with reference to the drawings. In this embodiment, a drive circuit array substrate using organic EL (electroluminescence) elements of a bottom emission type will be discussed by way of example.

Figure 1:
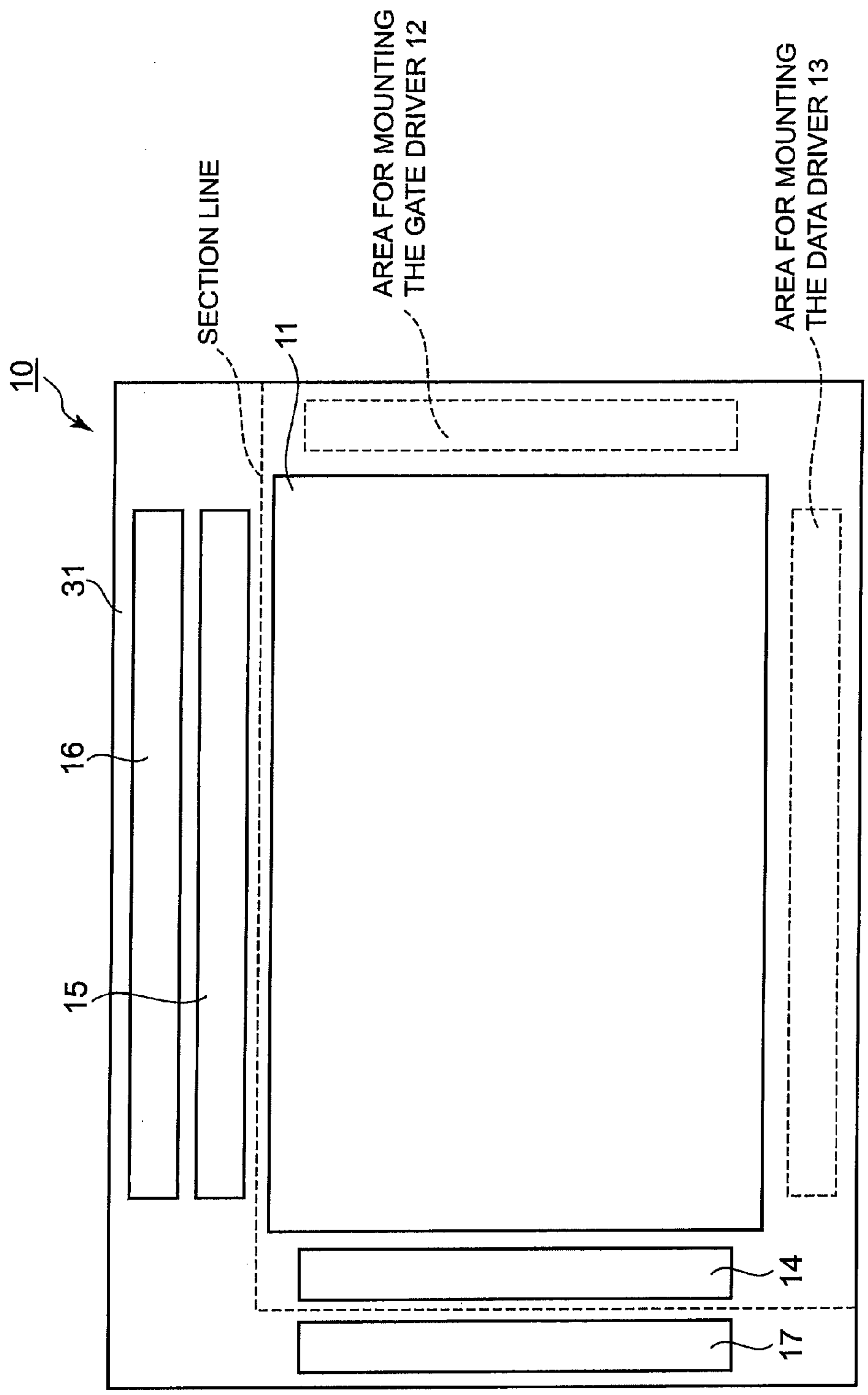
FIG. 1 is an illustration showing a drive circuit array substrate before the driver ICs are mounted.
Figure 2:
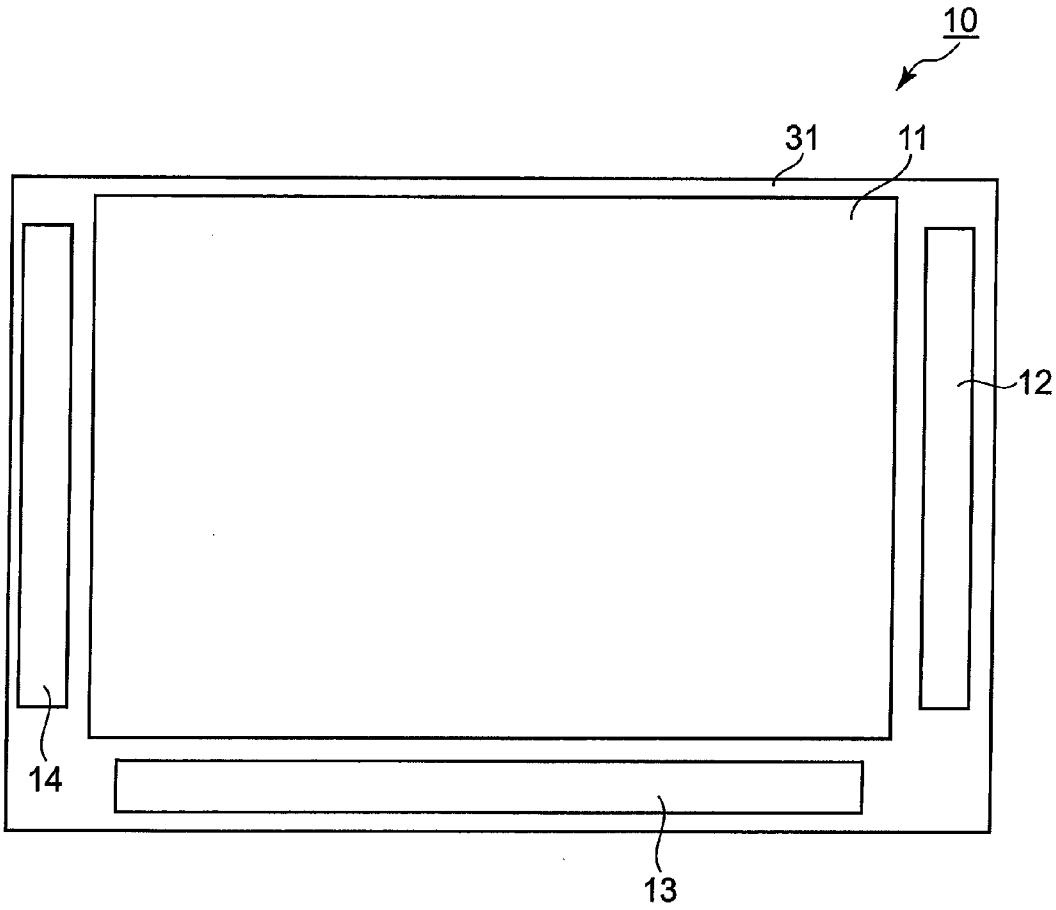
FIG. 2 is an illustration showing a drive circuit array substrate after the driver ICs are mounted.
Figure 3A:
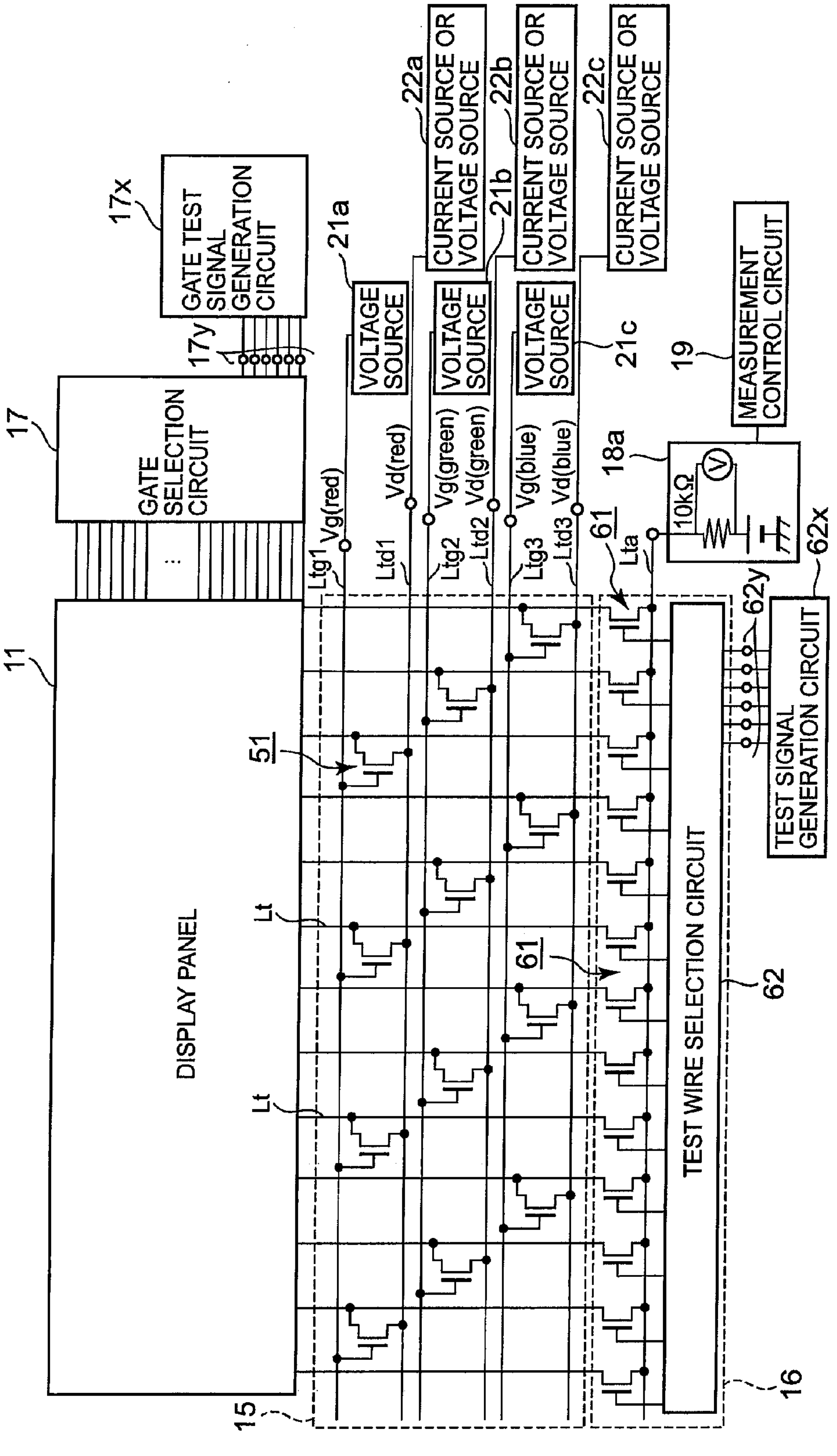
FIG. 3A is an illustration showing the gate selection circuit, data voltage application circuit, and data selection circuit with a voltage source in the measuring part.
Figure 3B:
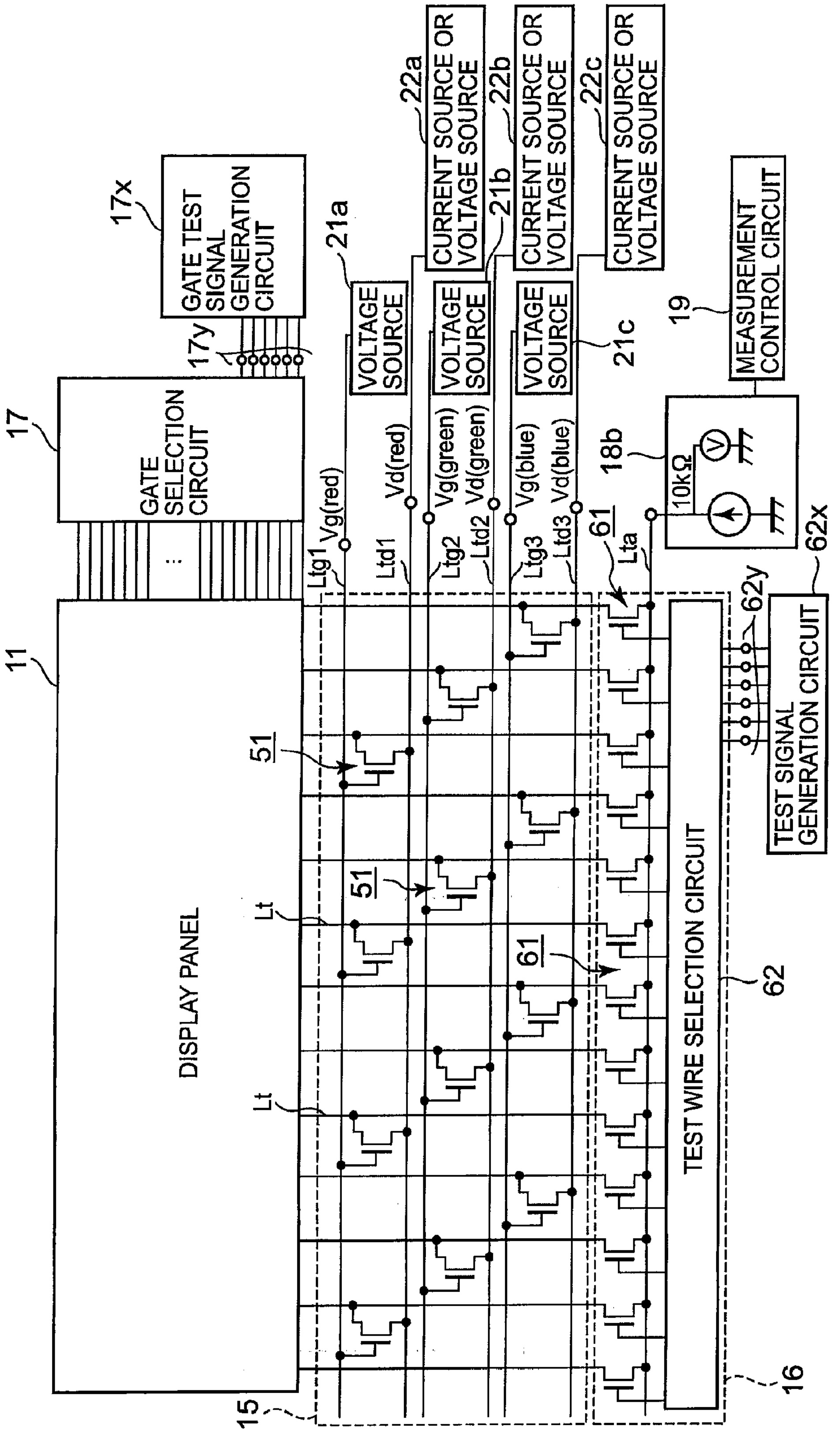
FIG. 3B is an illustration showing the gate selection circuit, data voltage application circuit, and data selection circuit with a current source in the measuring part.
Figure 4:
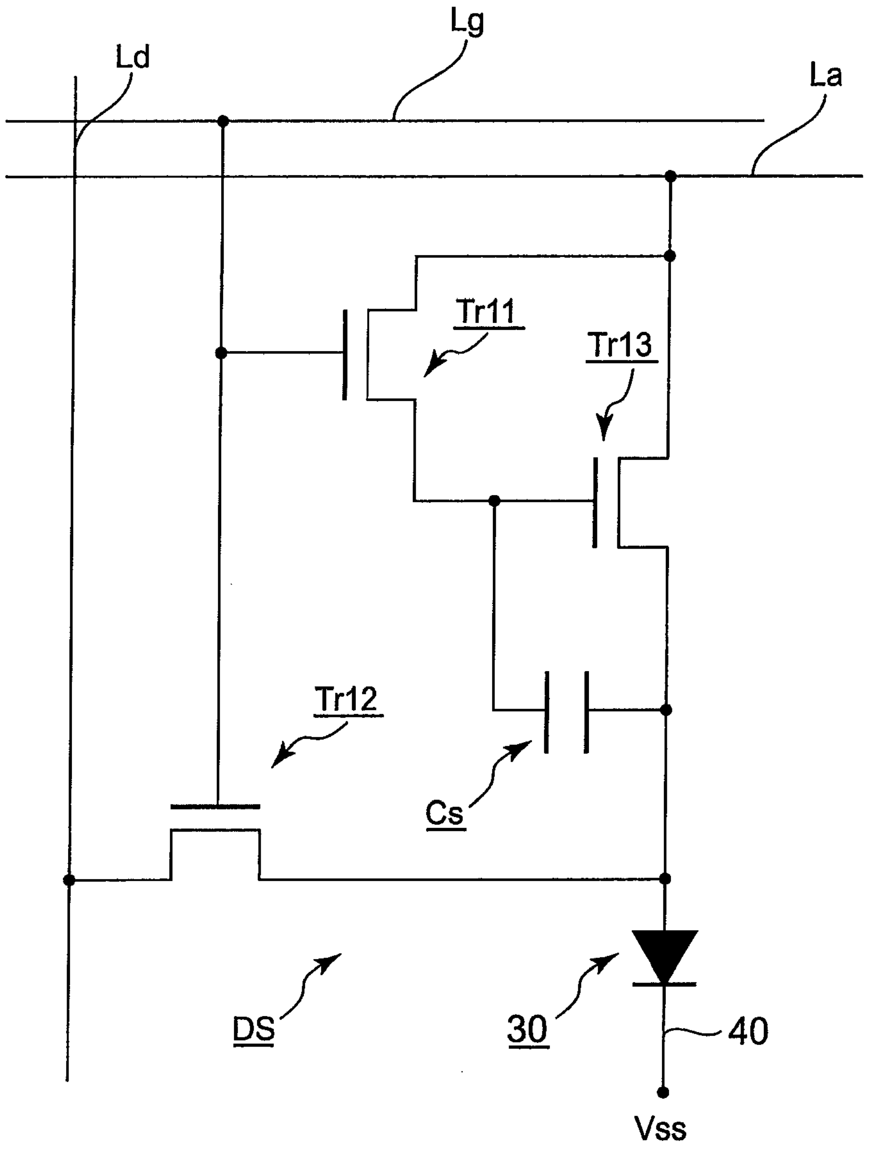
FIG. 4 is an illustration showing an equivalent circuit to an optical element drive circuit.
Figure 5A:
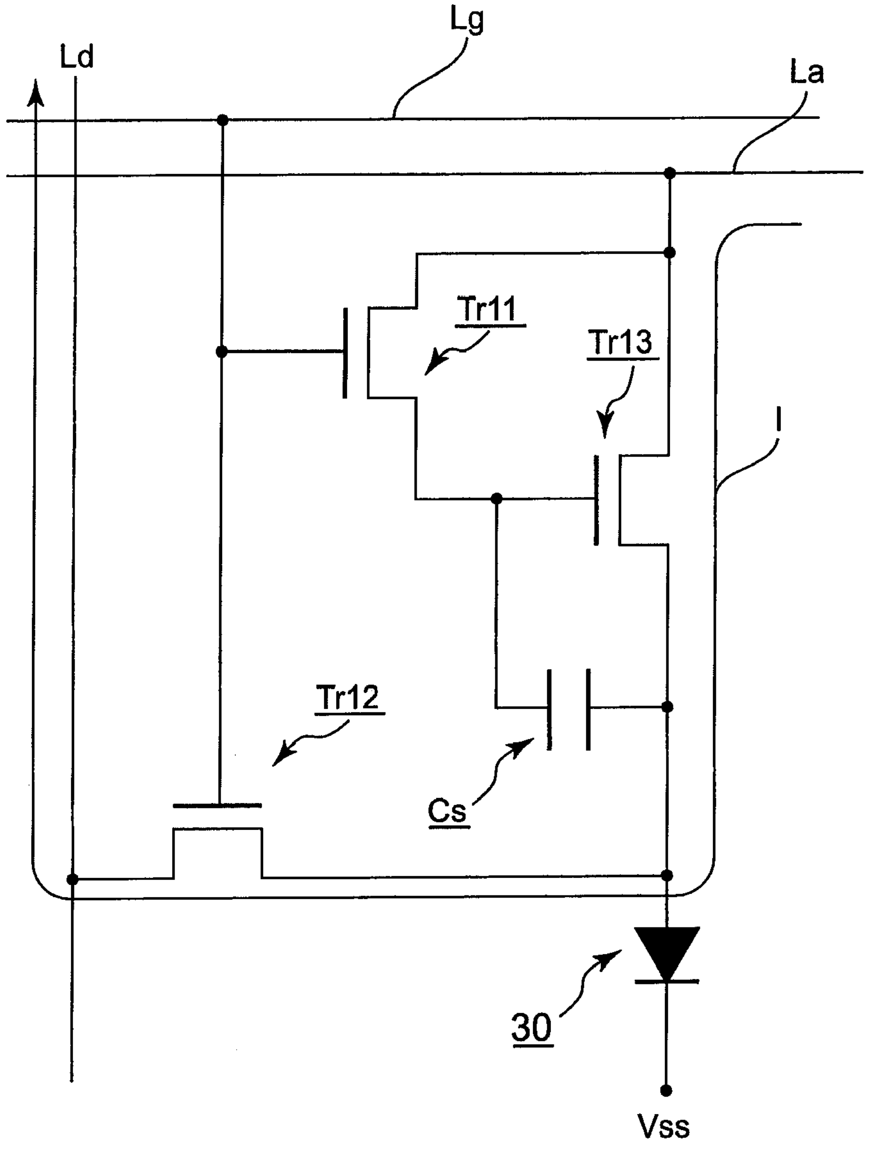
FIG. 5A is an illustration for explaining the writing.
Figure 5B:
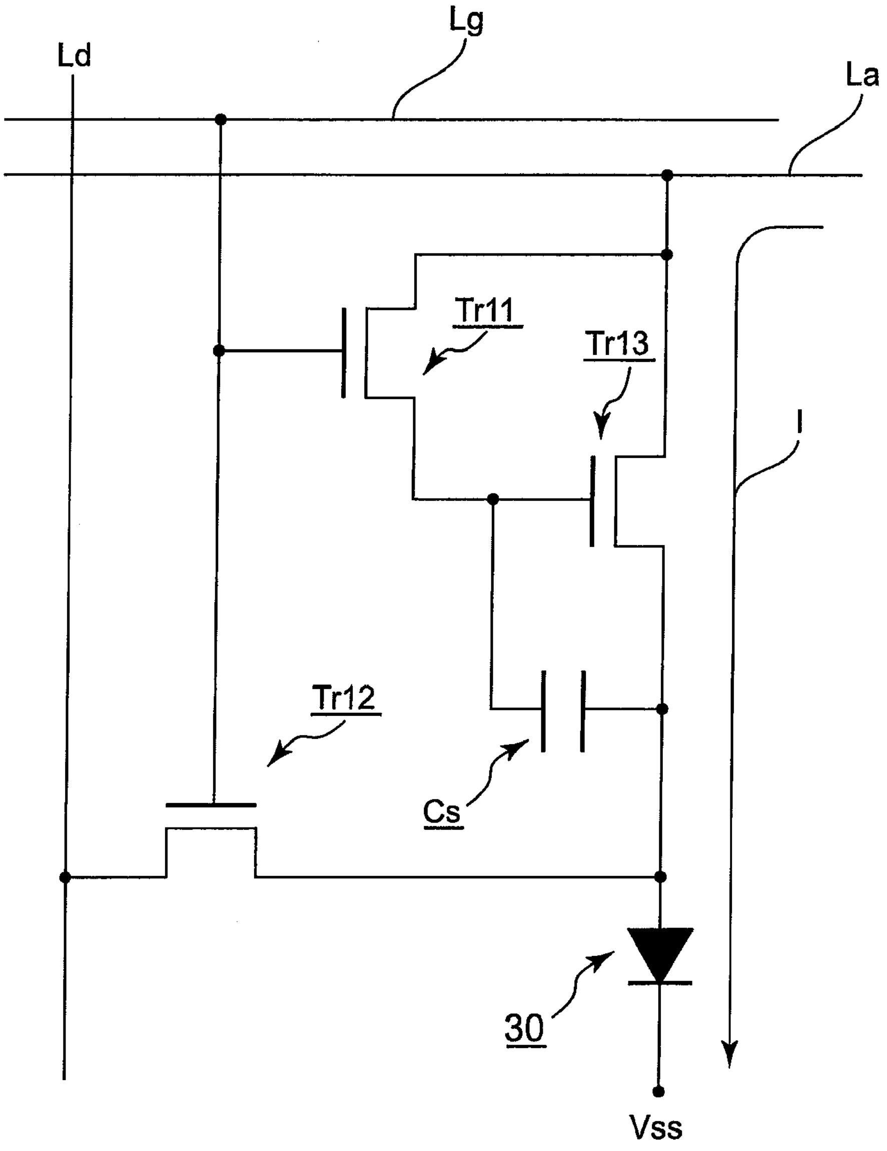
FIG. 5B is an illustration for explaining the light emission.
Figure 5C:
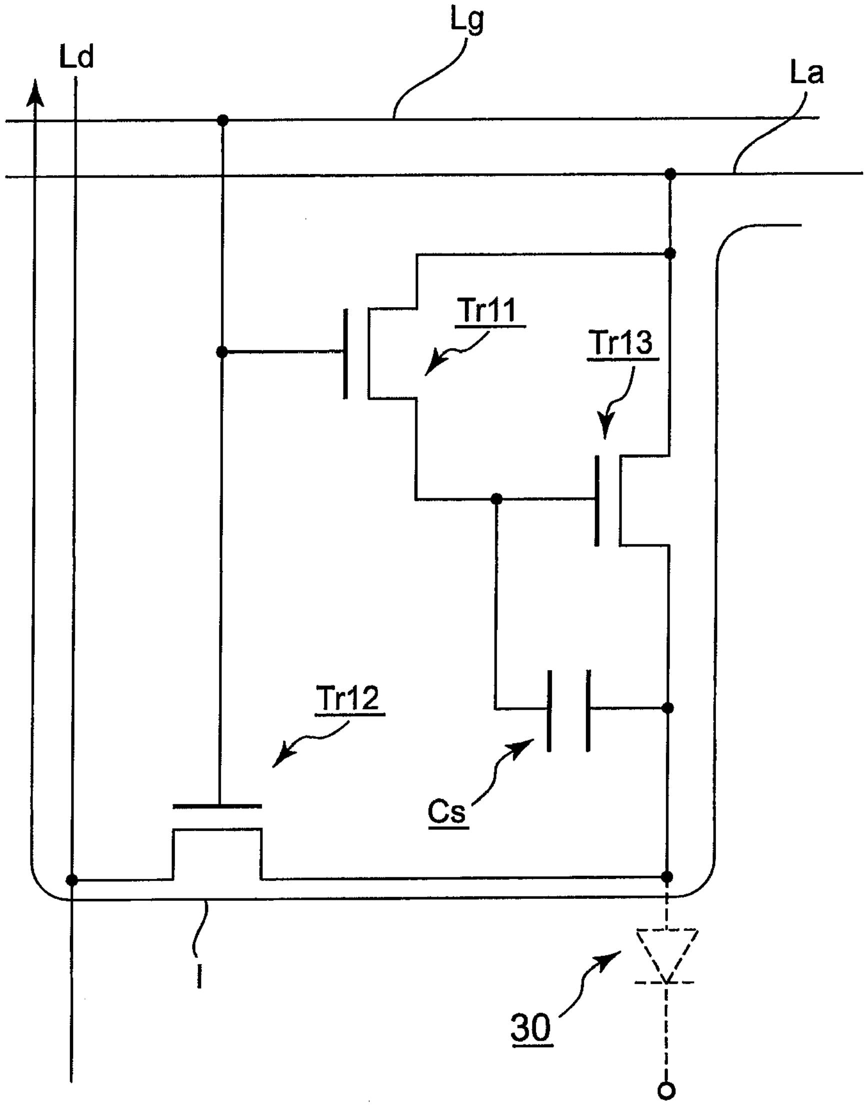
FIG. 5C is an illustration for explaining the measurement of transistor characteristics before the organic EL elements are formed.
Figure 6:
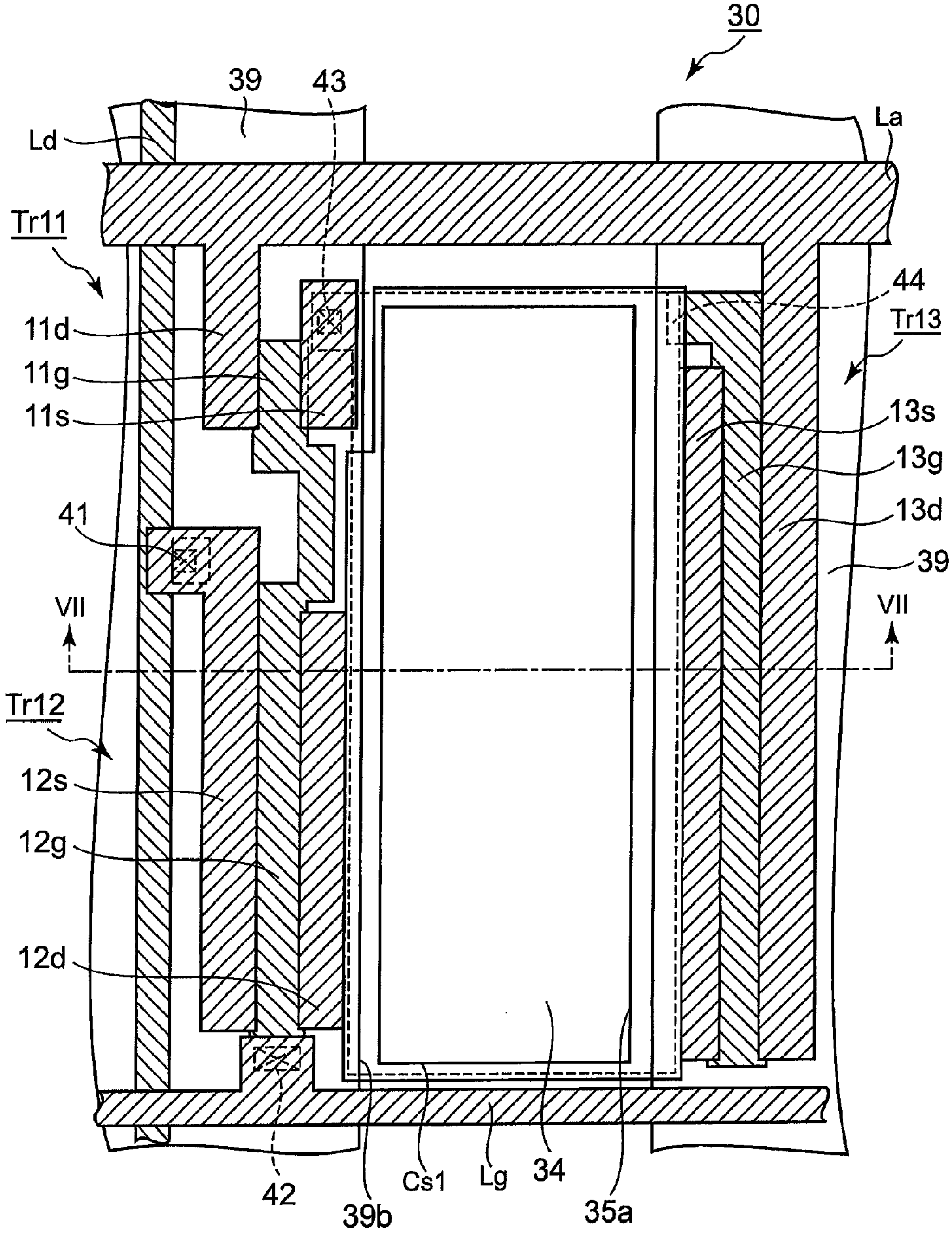
FIG. 6 is a plane view showing a structure of the optical element.
Figure 7:
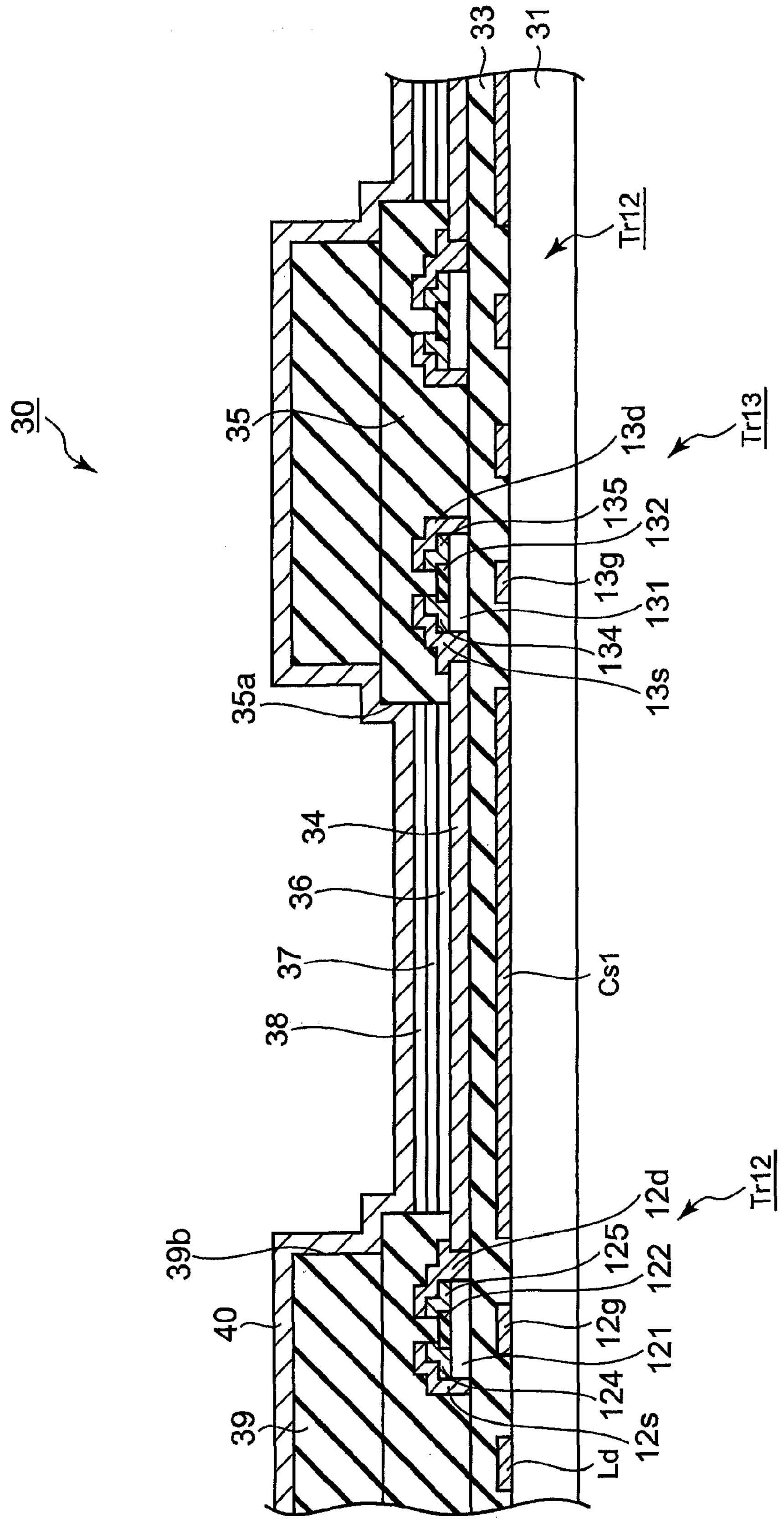
FIG. 7 is a cross-sectional view at the line VII-VII in FIG. 6.

FIGS. 1 and 2 are illustrations showing an exemplary structure of a drive circuit array substrate 10 according to an embodiment. FIG. 1 is an illustration showing the drive circuit array substrate 10 before the driver ICs are mounted and FIG. 2 is an illustration showing the drive circuit array substrate 10 after the driver ICs are mounted. Furthermore, FIGS. 3A and 3B are illustrations showing the gate selection circuit, data voltage application circuit, and data selection circuit. FIG. 4 is an illustration showing an equivalent circuit to the optical element drive circuit. FIGS. 5A, 5B and 5C are illustrations for explaining the writing and light emission of an organic EL element (an optical element) 30. FIG. 6 is a plane view of the organic EL element 30. FIG. 7 is a cross-sectional view at the line VII-VII in FIG. 6.

The drive circuit array substrate 10 comprises, as shown in FIGS. 1 and 2, an pixel forming zone 11, a gate driver 12, a data driver 13, an anode driver 14, a data voltage application circuit (light emitting element test circuit) 15, a data selection circuit (selection control signal supply circuit/drive element test circuit) 16, and a gate selection circuit (control signal supply circuit) 17. The pixel forming zone 11 comprises organic EL elements 30 arranged in n rows×m columns. The data voltage application circuit 15, data selection circuit 16, gate selection circuit 17, and anode driver 14 are output circuits used for aging, lighting test of the organic EL elements 30 and transistor characteristics inspection. They are formed on the optical element substrate 31 along the sides. For separating the optical element drive circuit DS before the gate driver 12 and the like are mounted, the optical element substrate 31 is cut along the section lines indicated by the dotted lines in FIG. 1 using laser or glass cutter to remove the output circuits (the data voltage application circuit 15, data selection circuit 16, and gate selection circuit 17) from the finished drive circuit array substrate 10 as shown in FIG. 2.

The data voltage application circuit 15 is provided along a side of the pixel forming zone 11 (preferably a side along which the data driver 13 is not mounted afterward). The reason that the voltage application circuit 15 is preferably provided along a side different from the side along which the data driver 13 is mounted afterward is that the wiring for making contact between the data line Ld and data driver 13 and between the data line Ld and data voltage application circuit may become complicated if the data voltage application circuit 15 and the data driver 13 are provided along the same side. The data voltage application circuit 15 comprises, as shown in FIGS. 3A and 3B, testing data voltage supply wires (the second wires) Ltd (Ltd1 to Ltd3) arranged in the row direction along a side of the pixel forming zone 11, testing gate wires (the third wires) Ltg (Ltg1 to Ltg3) arranged in the row direction along a side of the pixel forming zone 11, test wires (the first wires) Lt arranged in the column direction to intersect with the data voltage supply wires Ltd and testing gate wires Ltg, and output control switches provided between the data voltage supply wires and testing data wires (the output control transistors, hereafter) 51.

Each output control transistor 51 is a TFT consisting of, for example, an n-channel type FET (field effect transistor), such as an amorphous silicon TFT comprising an a-Si semiconductor layer, a protective insulating layer, a drain electrode, a source electrode, an ohmic contact layer made of a-Si containing an n-type impurity, and a gate electrode. The output control transistor 51 can be formed in the same step as a first selection transistor Tr11, a second selection transistor Tr12 (selection element), and a light emission drive transistor (drive element) Tr13 of an optical element drive circuit DS. The output control transistor 51 has a current path between the drain and source electrodes. The drain electrode forming one end of the current path is connected to the test wire Lt. The source electrode forming the other end of the current path is connected to the data voltage supply wire Ltd. The gate electrode is connected to the testing gate wire Ltg.

The test wires Lt are provided as many as the data lines Ld in the pixel forming zone 11. For example, when m organic EL elements 30 are arranged in the column direction in the pixel forming zone 11, m test wires Lt are provided. The test wires Lt are connected to the data lines Ld in the pixel forming zone 11, respectively. In this embodiment, corresponding to the three, red (R), green (G), and blue (B), organic EL elements 30, three each of the data voltage supply wires Ltd and testing, gate wires Ltg are provided.

Current sources or voltage sources 22*a*, 22*b*, and 22*c* are connected to the data voltage supply wires Ltd1 to Ltd3 via probes, respectively. When the current sources or voltage sources 22*a*, 22*b*, and 22*c* are connected, Vd (red), Vd (green), and Vd (blue) corresponding to the luminance gradient are supplied to the data voltage supply wires Ltd1 to Ltd3 from the current sources or voltage sources 22*a*, 22*b*, and 22*c*.

Voltage sources 21*a*, 21*b*, and 21*c* are connected to the testing gate wires Ltg1 to Ltg3 via probes. When the voltage sources are connected, voltages Vg (red), Vg (green), and Vg (blue) that turn on the output control transistors 51 are applied from the voltage sources. Any number of data voltage supply wires Ltd and testing gate wires Ltg can be provided.

The data selection circuit 16 comprises, as shown in FIGS. 3A and 3B, read switches (the read transistors, hereafter) 61 and a test wire selection circuit 62 supplying high-level or low-level signals. Each read transistor 61 is an TFT consisting of an n-channel type FET, such as an amorphous silicon TFT comprising an a-Si semiconductor layer, a protective insulating layer, a drain electrode, a source electrode, an ohmic contact layer made of a-Si containing an n-type impurity, and a gate electrode. The read transistor 61 can be formed in the same step as a first selection transistor Tr11, a second selection transistor Tr12, and a light emission drive transistor Tr13 of an optical element drive circuit DS. The read transistors 61 are provided on each test wire Lt. When there are m test wires Lt, m read transistors 61 are provided. The read transistor 61 has a current path between the drain and source electrodes. The gate of the read transistor 61 is connected to a test wire selection circuit 62. The drain electrode forming one end of the current path is connected to the test wire Lt. The source electrode forming the other end of the current path is connected to a feeder wire Lta. The feeder wire Lta is connected to an external measuring part 18*a* or 18*b* and a measurement control circuit 19 via a probe.

Figure 9:
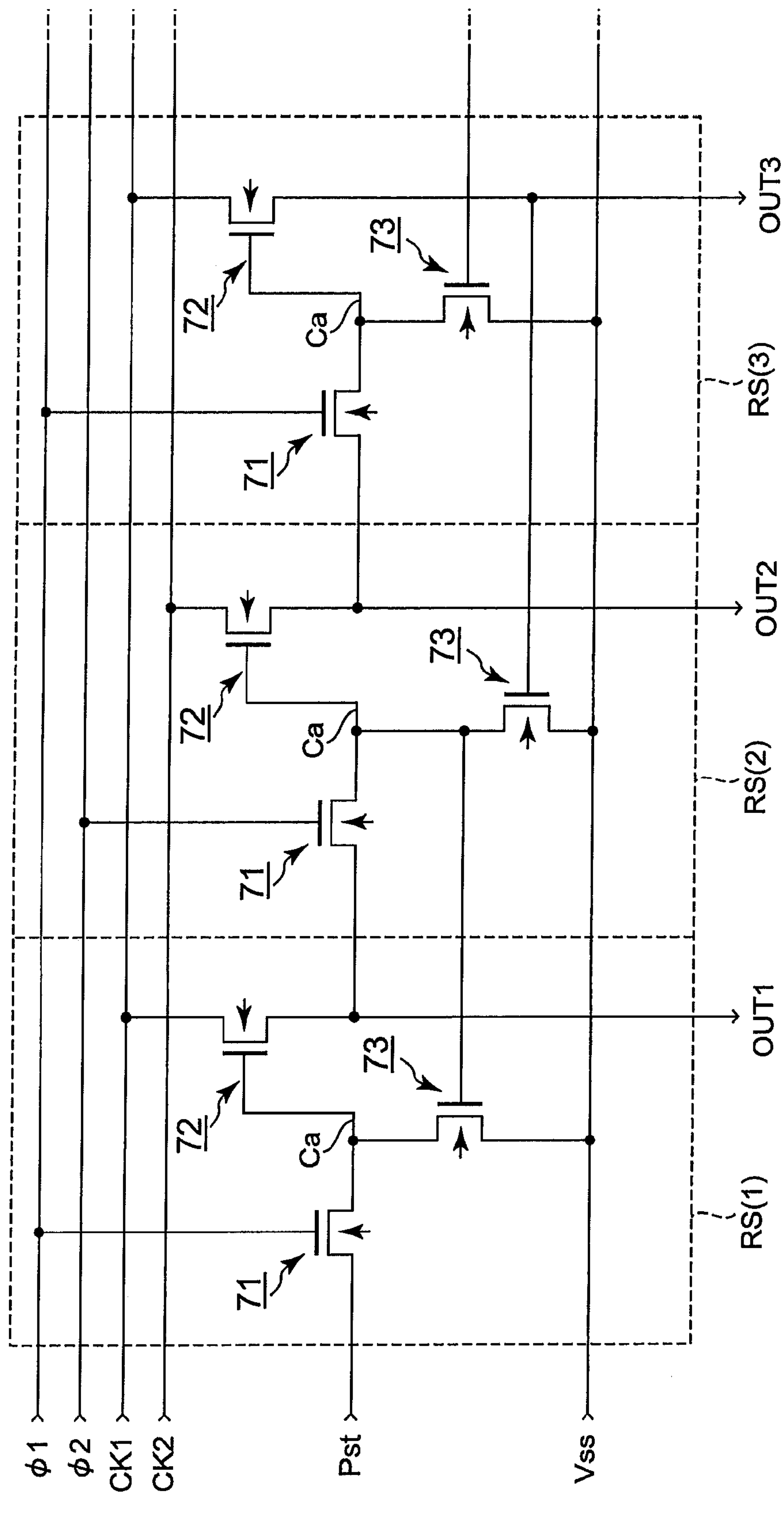
FIG. 9 is an illustration showing a shift register circuit.
Figure 10:
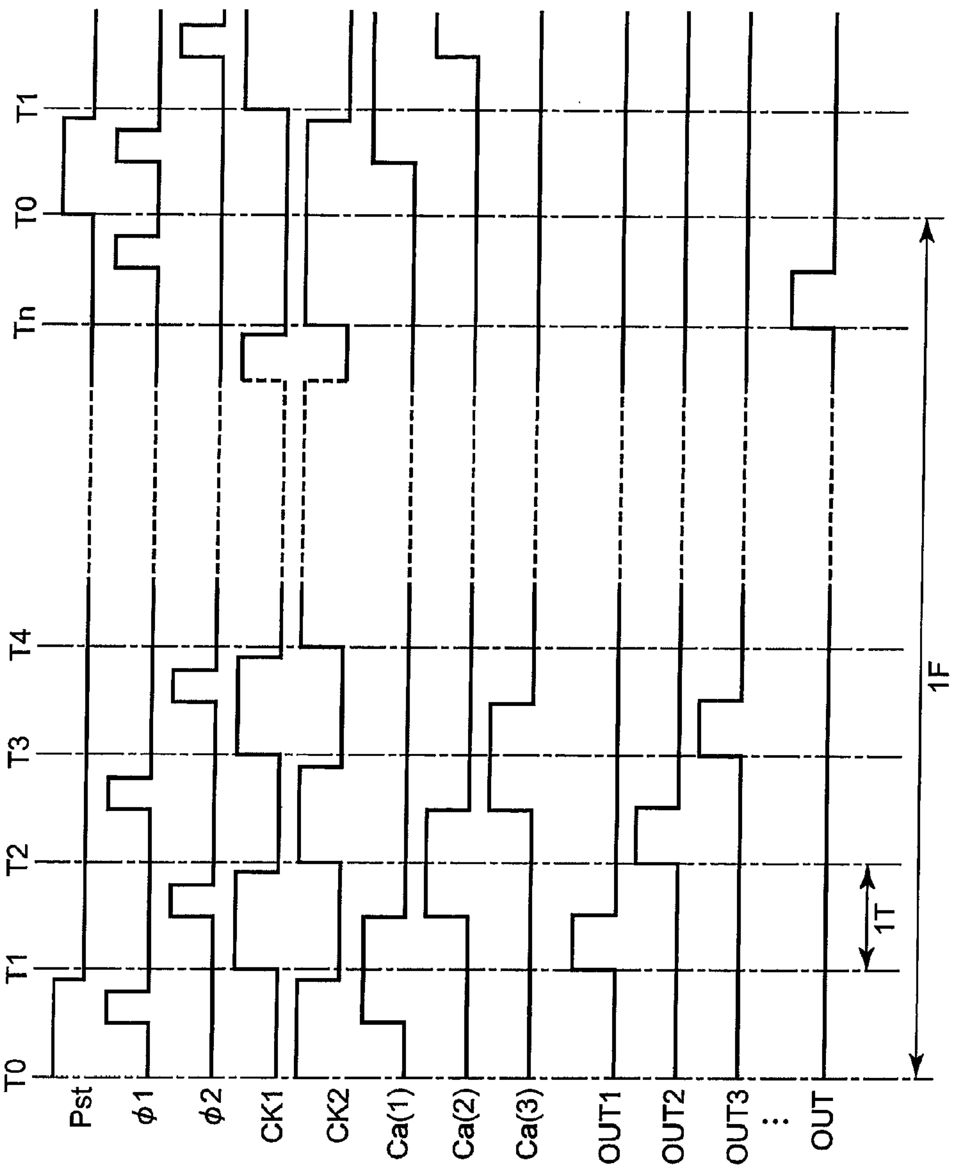
FIG. 10 is a timing chart of the shift register circuit shown in FIG. 9.

The test wire selection circuit 62 is a so-called shift register circuit comprising amorphous silicon TFTs. The test wire selection circuit 62 outputs a high-level (on-level ON) pulse to the read transistors 61 in sequence from the one in the column 1 to the one in the column m. The shift register circuit has, for example, the structure shown in FIG. 9. An external test signal generation circuit 62*x* is connected to test signal input terminals 62*y* via probes. The shift register circuit receives control signals from the test signal generation circuit 62*x*. Control signals supplied to the test signal input terminals 62*y* include a clock signal CK1 supplied to the drains of signal output transistors 72 in the odd-numbered tiers and becoming an output signal OUT, a clock signal CK2 supplied to the drains of signal output transistors 72 in the even-numbered tiers and becoming an output signal OUT, a signal $\phi$1 supplied to the gates of input transistors 71 in the odd-numbered tiers, a signal $\phi$2 supplied to the gates of input transistors 71 in the even-numbered tiers, a start pulse signal Pst, and a reference voltage Vss. Among them, the start pulse signal Pst is supplied to the first tier RS (1). The behavior of the shift register shown in FIG. 9 is shown in the timing chart of FIG. 10. The capacitance created by the wires connecting the source of an input transistor 71, gate of a signal output transistor 72, and drain of a reset transistor 73 in a tier is termed the wire capacitance Ca. In FIG. 10, a period 1T presents one line period and a period 1F presents one frame period. The output signals OUT are supplied to the read transistors 61.

The gate selection circuit 17 is connected to the gate lines Lg of the optical element drive circuits DS in the pixel forming zone 11. The gate selection circuit 17 is a so-called shift register comprising amorphous silicon TFTs and outputs a high-level (on-level ON) pulse to the gate lines Lg in sequence from the one in the row 1 to the one in the row n. The shift register circuit of the gate selection circuit 17 has nearly the same structure as the test wire selection circuit 62. It has, for example, the structure shown in FIG. 9. Control signals are supplied to gate test signal input terminals 17*y* from an external gate test signal generation circuit 17*x* via probes. Control signals supplied to the gate test signal input terminals 17*y* include a clock signal CK1 supplied to the drains of signal output transistors 72 in the odd-numbered tiers and becoming an output signal OUT, a clock signal CK2 supplied to the drains of signal output transistors 72 in the even-numbered tiers and becoming an output signal OUT, a signal $\phi$1 supplied to the gates of input transistors 71 in the odd-numbered tiers, a signal ϕ2 supplied to the gates of input transistors 71 in the even-numbered tiers, a start pulse signal Pst, and a reference voltage Vss.

The anode driver 14 is connected to the anode lines La of the optical element drive circuits DS in the pixel forming zone 11. The anode driver 14 sets the anode lines La to a high level H or to a low level L.

The gate test signal generation circuit 17x, voltage sources 21a, 21b, and 21c, current sources or voltage sources 22a, 22b, and 22c, measuring part 18a or 18b, measurement control circuit 19, and test signal generation circuit 62x, which are provided outside the drive circuit array substrate 10 and connected via probes, are collectively termed the test device.

In this embodiment, the output circuits (data voltage application circuit 15, data selection circuit 16, and gate selection circuit 17) are used as described afterward for testing the organic EL elements 30 for lighting and aging and measuring the transistor characteristics of the drive circuits DS of the organic EL elements 30.

The gate driver 12 consists of an IC chip and outputs a high-level (on-level ON) pulse to the gate lines Lg in sequence from the one in the row 1 to the one in the row n in the pixel forming zone 11 according to a set of control signals output from the control circuit.

The data driver 13 consists of an IC chip. The data driver 13 is either a current driver applying a gradation current having a current value corresponding to the luminance gradient of the image data received by the control circuit, or a voltage driver applying a gradation voltage for applying a current having a value corresponding to the luminance gradient of the image data, thereby applying the current or voltage corresponding to the image data.

In this embodiment, the gate driver 12 and data driver 13 are mounted on the optical element substrate 31 using chip-on glass after the lighting test is conducted and the optical element substrate 31 is cut along the section lines to separate the output circuits from the optical element drive circuits DS.

The pixel forming zone 11 comprises a plurality of pixels arranged in a matrix on the optical element substrate 31 and each having an organic EL element (optical element) 30 and an optical element drive circuit DS making the organic EL elements 30 actively operate. In the pixel forming zone 11, a plurality of, for example m, sets of organic EL elements 30 are arranged in the row direction, each set consisting of three organic EL elements 30 emitting red (R), green (G), and blue (B) lights, respectively, and a plurality of, for example n, optical elements emitting the same color light are arranged in the column direction on the optical element substrate 31. In this way, the optical elements emitting R, G, or B light are arranged in a matrix of m×n. Here, the three, red (R), green (G), and blue (B), organic EL elements 30 can be in a delta arrangement.

The organic EL element 30 comprises, as shown in FIGS. 6 and 7, an optical element electrode 34, a hole-injection layer 36, an interlayer 37, a light emitting layer 38, and a counter electrode 40. The hole-injection layer 36, interlayer 37, and light emitting layer 38 serve as a carrier transport layer in which electrons or holes are transported as carrier. The carrier transport layer is provided between an interlayer insulating film 35 and a partition 39 arranged in the column direction.

The optical element drive circuit DS comprises, as shown in FIG. 4, a first selection transistor (selection element) Tr11 and a second selection transistor (selection element) Tr12 for selecting the optical element, a light emission drive transistor (drive element) Tr13 for driving the optical element, a capacitor Cs, and an organic EL element 30. The first selection transistor Tr11, second selection transistor Tr12, and light emission drive transistor Tr13 are each, for example, an inversely-staggered n-channel type TFT having an amorphous silicon semiconductor layer. The first selection transistor Tr11, second selection transistor Tr12, and light emission drive transistor Tr13 each have a current path formed between the drain and source electrodes and controlled by the voltage applied to the gate electrode.

The optical element drive circuits DS are connected to a plurality of anode lines (current supply wires) La, a counter electrode (second electrode) 40 that is a cathode formed by a single electrode layer shared by all optical elements and having a voltage Vss such as the ground potential, data lines (gradation signal wires) Ld connected to a plurality of optical element drive circuits DS arranged in a given column, and a plurality of gate lines (control signal wires) Lg selecting the first selection transistor Tr11 and second selection transistor Tr12 of a plurality of optical element drive circuits DS arranged in a given row.

As shown in FIGS. 6 and 7, the gate electrode 11g of the first selection transistor Tr11 is connected to the gate line Lg via a contact part 42 that is a contact hole formed in the insulating film 33 and the gate electrode 12g of the second selection transistor Tr12. Deposited on the drain electrode 11d of the first selection transistor Tr11, the anode line La is connected to the drain electrode 11d. Furthermore, the source electrode 11s of the first selection transistor Tr11 is connected to the capacitor electrode Cs1 via a contact part 43 that is a contact hole formed in the insulating film 33.

The drain electrode 12d of the second selection transistor Tr12 is connected to the source electrode 13s of the light emission drive transistor Tr13 via an optical element electrode (the first electrode) 34. The source electrode 12s is connected to a data line Ld via a contact part 41 that is a contact hole formed in the insulating film 33. Furthermore, the gate electrode 12g of the second selection transistor Tr12 is connected to a gate line Lg via the contact part 42.

The drain electrode 13d of the light emission drive transistor Tr13 is connected to an anode line La. The gate electrode 13g of the light emission drive transistor Tr13 is connected to the capacitor electrode Cs1 via a contact part 44 and further connected to the source electrode 11s of the first selection transistor Tr11 via the capacitor electrode Cs1. Furthermore, the source electrode 13s of the light emission drive transistor Tr13 is connected to the optical element electrode 34 by partially overlapping with it.

The capacitor Cs consists of a capacitor electrode Cs1, an optical element electrode 34 serving as another capacitor electrode, and an insulating film 33 made of, for example, silicon nitride and serving as a dielectric body lying between the capacitor electrode Cs1 and optical element electrode 34.

The writing and light emission of the optical element drive circuits DS after the gate driver 12 and data driver 13 are mounted will be described hereafter.

(Writing)

Figure 12:
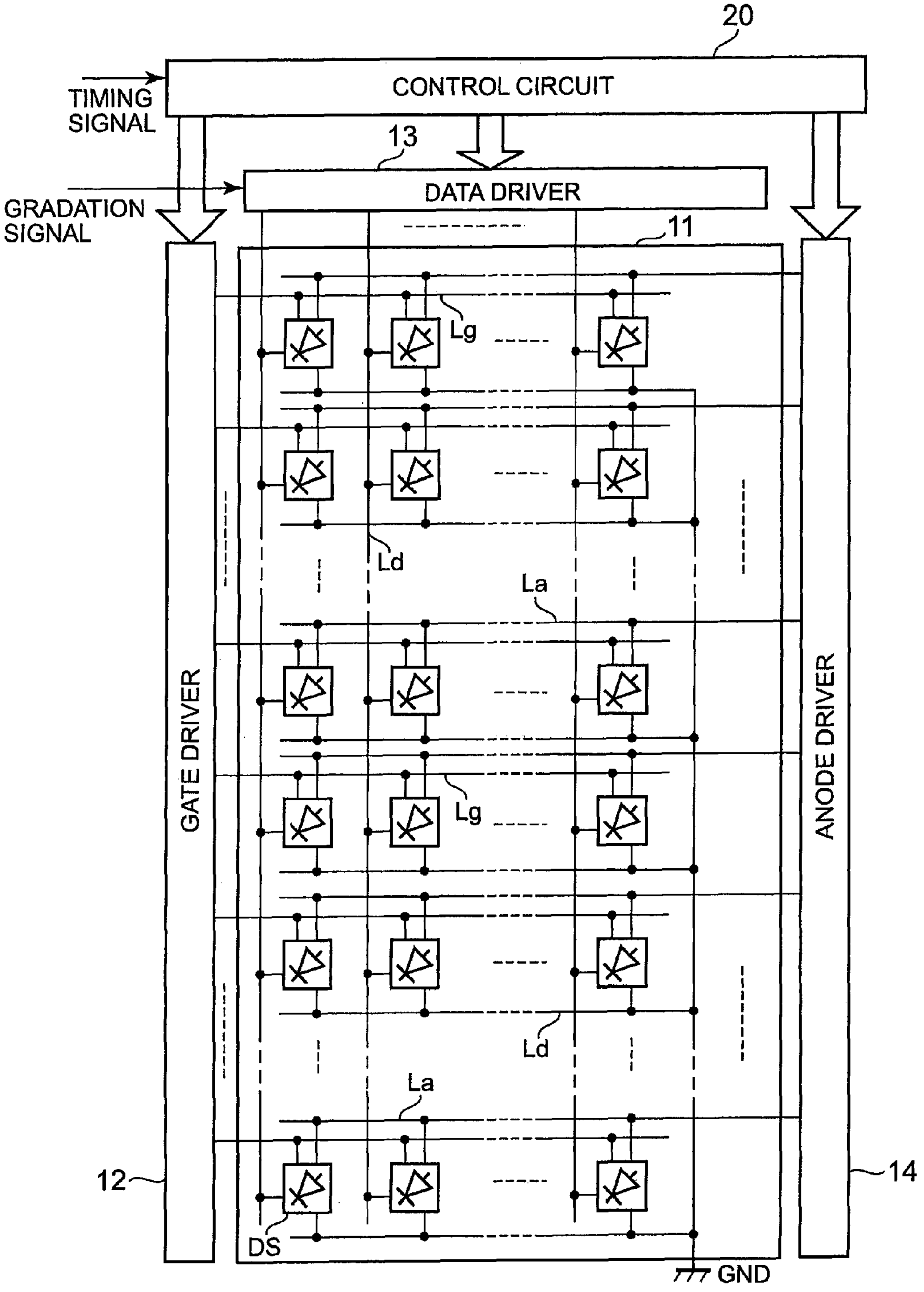
FIG. 12 is a simplified block diagram showing an exemplary entire configuration for driving the drive circuit array substrate after the driver ICs are mounted.

As shown in FIG. 12, the gate driver 12 outputs a high-level (on-level, ON) pulse to the gate lines Lg in sequence from the one in the row 1 to the one in the row n according to a set of control signals output from the control circuit 20 based on timing signals supplied from an external source. On the other hand, the anode driver 14 sets the anode lines La to a low-level, L, potential according to a set of control signals output from control circuit 20 while the on-level, ON, pulse is output to the gate lines Lg in every row (the scan period). The data driver 13 applies a gradation voltage having a voltage value lower than the reference voltage Vss or a gradation current running in the leading-in direction from the anode line La to the data driver 13, which corresponds to gradation signals from an external source, to the data lines in every row according to a set of control signals output from the control circuit 20 based on the gradation signals. The low-level, L, potential to which the anode lines La are set is equal to or lower than the reference voltage Vss.

As described above, the first selection transistor Tr11 and second selection transistor Tr12 are turned on while the on-level, ON, pulse is output to the gate lines Lg in every row. Thus, the gate and drain of the light emission drive transistor Tr13 are connected to each other and the light emission drive transistor Tr13 is diode-connected. Then, as shown in FIG. 5A, a current runs between the drain and source of the light emission drive transistor Tr13 via the data line Ld and second selection transistor Tr12 according to the gradation voltage or gradation current applied to the data lines Ld in every row from the data driver 13. Therefore, a voltage according to the current value of the current running between the drain and source of the light emission drive transistor Tr13 is applied between the gate and source of the light emission drive transistor Tr13.

The gate electrode 13*g* and drain electrode 13*d* of the light emission drive transistor Tr13 have an equal potential. Therefore, a potential difference occurs between the gate and source of the light emission drive transistor Tr13 and a current I having a current value according to the gradation voltage or gradation current applied from the data driver runs through the data line Ld in the arrowed direction in FIG. 5A. Here, during the scan period, the anode line La has a potential lower than the reference voltage Vss. Therefore, the anode of the organic EL element 30 has a potential equal to or lower than the cathode. The organic EL element 30 has zero voltage or an inversely biased voltage. Therefore, no current runs through the organic EL element 30 from the anode line La.

Then, a voltage corresponding to the current value of a current I running from the drain electrode 13*d* to the source electrode 13*s* of the light emission drive transistor Tr13 based on the gradation voltage or gradation current applied by the data driver 13 in accordance with the luminance gradient of the image data is established across the capacitor Cs of the organic EL element 30. More specifically, the capacitor Cs of the organic EL element 30 is charged enough to create a potential difference between the gate and source of the light emission drive transistor Tr13 that is necessary for running a current I according to the image data between the drain and source of the light emission drive transistor Tr13 of the organic EL element 30.

(Light Emission)

The pulse output to the gate lines Lg from the gate driver 12 is switched from an on level ON to an off level OFF and the potential of the anode lines La is switched from a low level L to a high level H by the anode driver 14. An off-level OFF (low-level) scan signal voltage is applied to the gate line Lg, gate of the first selection transistor Tr11, and gate of the second selection transistor Tr12. A high-level, H, potential to which the anode lines La are set is sufficiently higher than the reference voltage Vss and low level L.

Therefore, as shown in FIG. 5B, the second selection transistors Tr12 in the not-selected rows are turned off and, therefore, no current runs through them. Furthermore, the first selection transistor Tr11 is turned off. The capacitor Cs holds the charge acquired through one end and the other. The light emission drive transistor Tr13 stays on. In other words, a voltage value Vgs between the gate and source of the light emission drive transistor Tr13 is maintained. Therefore, the light emission drive transistor Tr13 continues to run a current having a current value corresponding to the image data during the light emission. The current value of the current I during the light emission is equal to the current value of the current I during the writing. During the light emission, the current I running through the light emission drive transistor Tr13 runs through the organic EL element 30. The organic EL element 30 emits light with a luminance according to the current value of the current I. In this way, the organic EL element 30 emits light with a luminance gradient corresponding to the image data.

In this embodiment, similar operations to the above described writing and light emission are conducted using the data voltage application circuit 15, data selection circuit 16, and gate selection circuit 17 for conducting the lighting test and aging test and measuring the transistor characteristics.

The lighting test and aging test and measurement of the transistor characteristics in this embodiment will be described hereafter.

(Lighting Test)

In the lighting test, first, the current sources or voltage sources 22*a*, 22*b*, and 22*c* are connected to the data voltage supply wires Ltd1 to Ltd3 via probes. The voltage sources 21*a*, 21*b*, and 21*c* are connected to the testing gate wires Ltg1 to Ltg3. The test signal generation circuit 62*x* and gate test signal generation circuit 17*x* are connected to the test signal input terminals 62*y* and gate test signal input terminals 17*y*, respectively. The test signal generation circuit 62*x* is controlled so that the test wire selection circuit 62 outputs a low level L over all (for example, a start pulse signal Pst is kept at a low level in the shift register circuit shown in FIG. 9), whereby all read transistors 61 are turned off.

Then, the above described writing and light emission is conducted on the optical element drive circuits DS for checking on the lighting. In the lighting test, the following matters are confirmed in white, gray, black, red, blue, and green display: there is no point defects (dark point, bright point) or line defects (totally dark line, totally bright line, partly dark line, partly bright line), the deviation in luminance between adjacent optical elements is within a reference value (for example, within 4%), the deviation in luminance in the plane is within a reference value (for example, within 10%). The lighting test in which the red organic EL element 30 in the row s are turned on will be described hereafter by way of example.

First, during the writing, the gate selection circuit 17 outputs a high-level (on-level, ON) pulse to the gate lines Lg in sequence from the one in the row 1 to the one in the row n. Here, while an on-level, ON, pulse is output to the gate line Lg in the row s (the scan period), the anode driver 14 sets the anode line La in the row s to a low-level, L, potential. The low-level, L, potential to which the anode line La is set is equal to or lower than the reference voltage Vss.

During the scan period, a high-level (on-level) signal is supplied to the testing gate wire Ltg (here, for example, Ltg1) to turn on the output control transistor 51. Furthermore, a current or voltage corresponding to an intended luminance gradient is applied to the data voltage supply wire Ltd (here, for example, Ltd1) from the current sources or voltage sources 22*a*, 22*b*, and 22*c*.

Here, the first selection transistor Tr11 and second selection transistor Tr12 of the optical element drive circuit DS have been turned on. A current according to the voltage or current applied from the data voltage supply wire Ltd runs from the anode line La to the data voltage supply wires Ltd via the light emission drive transistor Tr13 and second selection transistor Tr12. Consequently, as shown in FIG. 5A discussed above, a voltage according to the current value of the current running between the drain and source of the light emission drive transistor Tr13 is applied between the gate and source thereof.

During the scan period, the anode of the organic EL element 30 has a potential equal to or lower than the cathode. Therefore, no current runs through the organic EL element 30 from the anode line La. The capacitor Cs of the organic EL element 30 is charged to create a potential difference between the gate and source of the light emission drive transistor Tr13 that corresponds to the voltage or current applied between the drain and source of the light emission drive transistor Tr13 from the data voltage supply wire Ltd and is necessary to run a current corresponding to an intended luminance gradient.

Then, the light emission is conducted.

In the light emission, the pulse output from the gate selection circuit 17 to the gate lines Lg is switched from an on level ON to an off level OFF and the anode driver 14 switches the potential of the anode lines La from a low level L to a high level H. Consequently, the gates of the first and second selection transistors Tr11 and Tr12 are turned off.

Simultaneously, a low-level (off-level) signal is supplied to the testing gate wire Ltg (here, for example, Ltg1) and the output control transistor 51 is turned off Therefore, as shown in FIG. 5B, the second selection transistors Tr12 in the non-selected rows are turned off and no current runs through them. Furthermore, the first selection transistor Tr11 is turned off The capacitor Cs holds the charge acquired through one end and the other. The light emission drive transistor Tr13 stays on. Consequently, the light drive transistor Tr13 continues to run a current having a current value according to the voltage or current applied from the data voltage supply wire Ltd and corresponding to an intended luminance gradient. Consequently, the organic EL element 30 emits light with a luminance gradient according to the voltage or current applied from the data voltage supply wire Ltd.

The lighting is visually inspected to confirm the following matters and obtain a result OK/NG: there is no point defect or line defect, the deviation in luminance between adjacent optical elements is within a reference value, and the deviation in luminance in the plane is within a reference value.

(Aging Test)

In the aging test, the above described writing and light emission is conducted in a high temperature (for example, 60° C.) environment to allow the organic EL elements 30 to emit light for a period of time (for example, one hour) in which an intended aging effect is obtained. Then, it is determined whether they pass the above lighting test and whether the power consumption, luminance, and trichromatic coordinate values fall under the initial specification range.

By conducting the abode described writing and light emission, it will be found whether or not intended organic EL elements 30 emit light normally. As described above, in this embodiment, the gate line Lg is turned on/off by the gate selection circuit 17 and the writing into the light emission drive transistor Tr13 is conducted by the data voltage application circuit 15. Consequently, the lighting test and aging test can be conducted without providing probes to all wires for turning on the organic EL elements 30.

(Measurement of Transistor Characteristics)

In the measurement of characteristics, a similar operation to the above described writing is conducted to measure the current and voltage values running through the light emission drive transistor Tr13. The measurement of transistor characteristics of the light emission drive transistor Tr13 of a red (R) organic EL element 30 in the row s and column t will be described hereafter.

Figure 11:
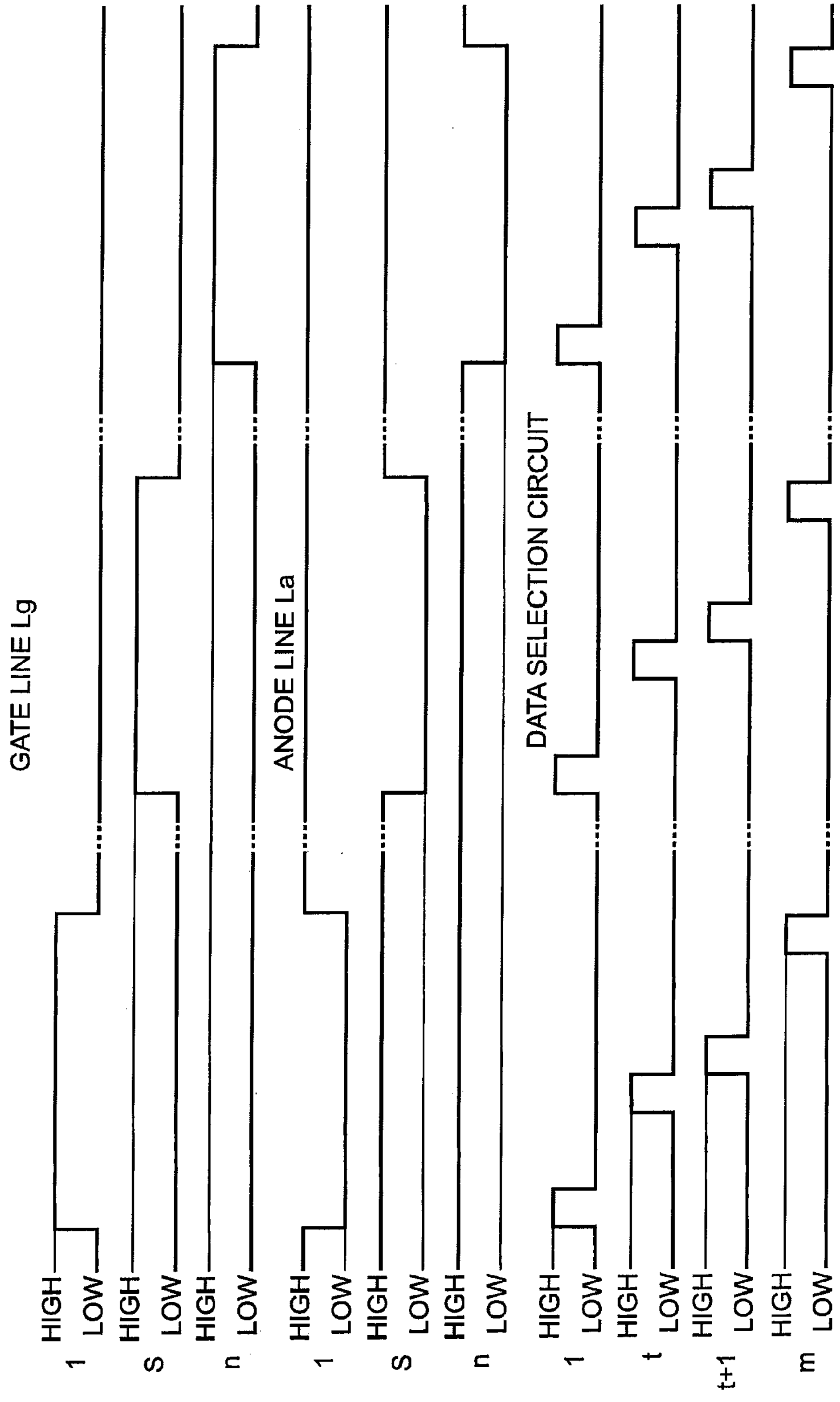
FIG. 11 is a timing chart in measuring the transistor characteristics.

FIG. 11 shows the timing chart with the data selection circuit 16 and gate selection circuit 17 in measuring the transistor characteristics of the light emission drive transistor Tr13 of a red (R) organic EL element 30 in the row s and column t.

In the measurement of transistor characteristics, first, the voltage sources 21*a*, 21*b*, and 21*c* are connected to the testing gate wires Ltg1 to Ltg3, the test signal generation circuit 62*x* and gate test signal generation circuit 17*x* are connected to the test signal input terminals 62*y* and gate test signal input terminals 17*y*, respectively, and the measuring part 18*a* is connected to the feeder wire Lta, all via probes. Then, the application of a voltage or current to all data voltage supply wires Ltd is cut off and a low-level (off-level) signal is applied to all testing gate wires Ltg so as to turn off all output control transistors 51. As shown in FIG. 3A, the measuring part 18*a* has a voltage source supplying a voltage, an amperometric resistance, and a voltmeter measuring the voltage across the amperometric resistance. The measuring part 18*a* is connected to the measurement control circuit 19.

Then, the anode driver 14 sets the anode line La in the row s to a low level, L, potential while an on-level, ON, pulse is output to the gate line Lg in the row s (the scan period). During the scan period, the test wire selection circuit 62 of the data selection circuit 16 supplies a high-level signal to the read transistors 61 in the row t to turn on the read transistors 61.

Then, as shown in FIG. 3A, the measuring part 18*a* supplies a predetermined voltage to the test wire Lt via the feeder wire Lta and read transistors 61. The measuring part 18*a* measures the voltage across the amperometric resistance by means of the voltmeter so as to measure the current value of the current running through the feeder wire Lta.

Meanwhile, the optical element drive circuits DS of the pixels in the row s is set for the writing mode and the light emission drive transistors Tr13 of these optical element drive circuits DS are diode-connected. Therefore, when a predetermined voltage is supplied from the voltage source of the measuring part 18*a*, a current runs through the drain and source of the light emission drive transistors Tr13 via the feeder wire Lta, read transistor 61, test wire Lt, data line Ld, and second selection transistor Tr12. The measuring part 18*a* acquires the voltage value running through the test wire Lt based on the voltage value of the voltage across the amperometric resistance that is measured by the voltmeter.

The voltage source of the measuring part 18*a* can supply a voltage having a variable voltage value. In such a case, the current value of a current running through the test wire Lt can be measured for a plurality of voltage values of the supplied voltage so that the current-voltage characteristic corresponding to the element property of the light emission drive transistor Tr13 is measured.

The current running through the test wire Lt is measured while a voltage is supplied to the test wire Lt in FIG. 3A. Alternatively, as shown in FIG. 3B, a current having a predetermined current value can be supplied to the test wire Lt to measure the voltage of the test wire Lt. In such a case, the measuring part 18*b* has a current source supplying a current and a voltmeter measuring the voltage of the feeder wire Lta. Also in this case, the current source of the measuring part 18*b* can supply a current having a variable current value. In such a case, the voltage of the feeder wire Lta can be measured for a plurality of current values of the supplied current so that the current-voltage characteristic corresponding to the element property of the light emission drive transistor Tr13 is measured. The measurement control circuit 19, for example, compares the measurements obtained by the measuring part 18*a* or 18*b* with the reference value to determine whether the light emission drive transistor Tr13 is normal or abnormal and, hence, determine whether the drive circuit array substrate 10 is good or bad. The drive conditions for the display panel formed by the drive circuit array substrate 10 can be corrected based on the obtained current-voltage characteristics of the light emission drive transistor Tr13. Furthermore, when the measurement control circuit 19 detects any abnormal light emission drive transistors Tr13, the drive circuit array substrate 10 can be repaired based on the results.

During the scan period, the anode of the organic EL element 30 has a potential equal to or lower than the cathode and no current runs through the organic EL element 30 from the anode line La. In other words, the same behavior is observed even if no organic EL element 30 is formed. Therefore, as shown in FIG. 5C, the above described measurement of transistor characteristics can be conducted before the organic EL element 30 is formed.

The structure of the organic EL element 30 will be described hereafter.

The gate electrodes 11*g*, 12*g*, and 13*g* of the first selection transistor Tr11, second selection transistor Tr12, and light emission drive transistor Tr13 are formed on the optical element substrate 31 of the organic EL elements 30 by patterning the gate conductive layer. Further formed on the optical element substrate 31 of the organic EL elements 30 are one electrode Cs1 of the capacitor Cs and the data line Ld extending in the column direction. Furthermore, the insulating film 33 is formed to cover them, serving as a gate insulating film and a dielectric body of the capacitor.

When the organic EL elements 30 are of a bottom emission type and emit display light through the optical element substrate 31, the capacitor electrode Cs1 and optical element electrode 34 are transparent electrodes made of tin oxide-added indium oxide (indium tin oxide; ITO) or zinc oxide-doped indium oxide (indium zinc oxide). The gate electrode 13*g* of the light emission drive transistor Tr13 overlaps with the capacitor electrode Cs1 at the contact part 44.

The insulating film 33 is made of an insulating material such as a silicon oxide film and silicon nitride film and is so formed on the optical element substrate 31 as to cover the data line Ld, gate electrodes 12*g* and 13*g*, and capacitor electrode Cs1. A contact part is formed in the insulating film 33 as a contact hole for making the gate conductive layer and source/drain layer contact with each other.

The first selection transistor Tr11, second selection transistor Tr12, and light emission drive transistor Tr13 are each an n-channel type TFT. These transistors are formed on the optical element substrate 31 as shown in FIG. 7. As shown in FIG. 7, the second selection transistor Tr12 comprises an a-Si semiconductor layer 121, a protective insulating layer 122, a drain electrode 12*d*, a source electrode 12*s*, ohmic contact layers 124 and 125 made of a-Si containing an n-type impurity, and a gate electrode 12*g*. The light emission drive transistor Tr13 comprises an a-Si semiconductor layer 131, a protective insulating layer 132, a drain electrode 13*d*, a source electrode 13*s*, ohmic contact layers 134 and 135 made of a-Si containing an n-type impurity, and a gate electrode 13*g*. Although it is not shown, the first selection transistor Tr11 has the same structure as the second selection transistor Tr12.

The gate electrodes of the transistors Tr11, Tr12, and Tr13 are each formed by an opaque gate conductive layer selected at least from a Mo film, Cr film, Al film, Cr/Al laminated film, AlTi alloy film, AlNdTi alloy film, and MoNb alloy film. The drain and source electrodes are each formed by a source-drain conductive layer made of aluminum-titanium (AlTi)/Cr, AlNdTi/Cr, or Cr. The ohmic contact layers are formed between the drain/source electrodes and the semiconductor layer for low resistance contact.

The optical element electrode (anode electrode) 34 is made of a translucent conductive material such as tin oxide-added indium oxide (indium tin oxide; ITO) and zinc oxide-doped indium oxide (indium zinc oxide).

The interlayer insulating film 35 is formed by an insulating material such as a silicon nitride film. The interlayer insulating film 35 has an opening 35*a*. The opening 35*a* delimits the light emission layer 38 between the optical element electrode 34 and counter electrode 40, defining the light emission area of the organic EL element 30. Furthermore, the partition 39 has an opening 39*b* in the form of a groove extending in the column direction (the vertical direction in FIGS. 3A and 3B) through a plurality of organic EL elements 30.

The partition 39 is made of an insulating material, for example cured photosensitive resin such as polyimide. The partition 39 is formed on the interlayer insulating film 35. The partition 39 is arranged in stripes as shown in FIG. 6 and has the opening 39*b*. The partition 39 delimits the area without running out over the organic EL elements 30 adjacent in the row direction and emitting different color lights during the production, thereby preventing color mixture of the light emission layer 38. Here, the planar shape of the partition 39 is not restricted to this embodiment and can have a lattice form.

The hole-injection layer 36 is formed on the optical element electrode 34 and supplies holes to the light emission layer 38. The hole-injection layer 36 has an organic polymer or low molecular weight material or inorganic compound capable of injection and transportation of holes.

The interlayer 37 is formed on the hole-injection layer 36. The interlayer 37 is an organic compound layer suppressing hole injection of the hole-injection layer 36 to urge the recoupling of electron and hole in the light emission layer 38, thereby improving the luminance efficiency of the light emission layer 38.

The light emission layer 38 is formed on the interlayer 37. The light emission layer 38 emits light when a voltage is applied between the anode and cathode electrodes. The light emission layer 38 is made of a known polymer light emitting material capable of emitting fluorescence or phosphorescence such as red (R), green (G), and blue (B) light emitting materials containing conjugated double-bonded polymers including polyparaphenylene vinylene and polyfluorene polymers.

In a bottom emission type, the counter electrode (cathode electrode) 40 is provided on the side where the light emission layer 38 is formed and has a laminated structure having a layer made of a low work function conductive material such as Li, Mg, Ca, and Ba and a light-reflecting conductive layer such as Al formed thereon. In a top emission type, the counter electrode 40 is provided on the side where the light emission layer 38 is formed and has a transparent laminated structure having a very thin, for example approximately 10 nm, translucent, low work function layer such as Li, Mg, Ca, and Ba and an approximately 100 nm to 200 nm, translucent conductive layer such as ITO. In this embodiment, the counter electrode 40 is a single layer electrode layer extending over a plurality of organic EL elements 30 and a common voltage Vss, which is the ground potential, is applied to the counter electrode 40.

As described above, the drive circuit array substrate of this embodiment has a testing data voltage application circuit 15, data selection circuit 16, and gate selection circuit 17 that allow for the lighting test and the like without mounting any driver ICs. The data voltage application circuit consisting of a data voltage supplying wire, testing gate wire, test wire, and transistors connected to them allows for voltage supply to an intended data line without making the data lines contact with probes. Therefore, the number of probes can be reduced, the load on the display panel can be reduced, and the test can be conducted without using expensive panel contact jigs supporting many probes.

The present invention is not confined to the above described embodiment and various modifications and applications can be made thereto.

Figure 3C:
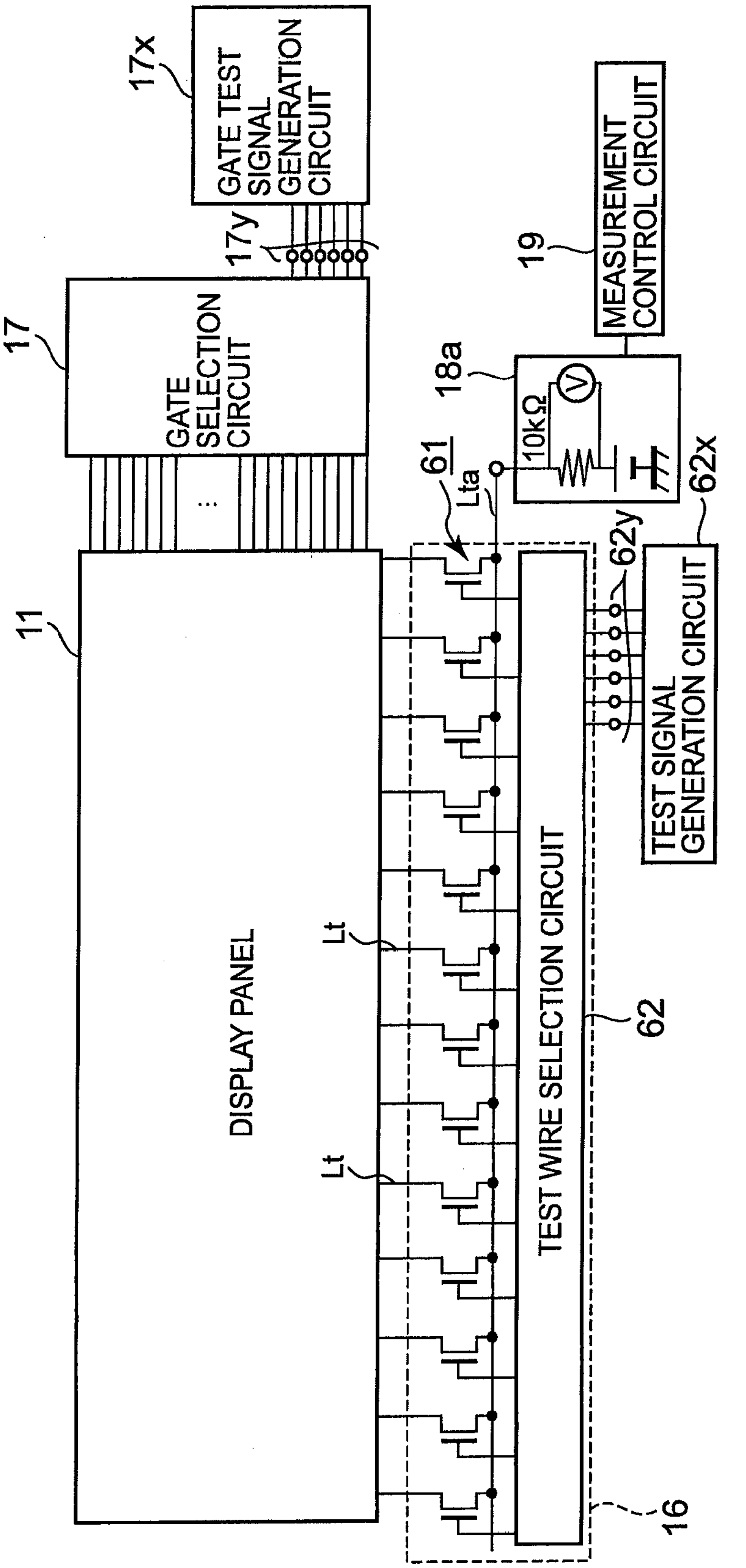
FIG. 3C is an illustration showing the gate selection circuit, data voltage application circuit, and data selection circuit with a voltage source in the measuring part.

In the above described embodiment, the explanation is made regarding a structure comprising a gate selection circuit 17 supplying a selection signal to the gate lines Lg, a data voltage application circuit 15 supplying gradation signals to the data lines Ld, and a data selection circuit 16. Any one or two of the gate selection circuit 17, data voltage application circuit 15, and data selection circuit 16 can be formed as a testing circuit(s). For example, as shown in FIG. 3C, when two testing circuits, the gate selection circuit 17 and the data selection circuit 16 are prepared, the measurement of transistor characteristics can be conducted either before or after the organic EL elements 30 are formed.

In the above described embodiment, the explanation is made with organic EL elements by way of example. Alternatively, liquid crystal display elements can be used. In such a case, the optical elements are liquid crystal display elements including back light.

In the above described embodiment, the explanation is made with organic EL elements of a bottom emission type. Alternatively, a top emission type can be used. When the organic EL elements 30 are of a top emission type and emit display light from the side where the counter electrode 40 is formed, the counter electrode 40 is a transparent electrode such as ITO. The capacitor electrode Cs1 is not necessarily transparent. The capacitor electrode Cs1 can be formed at the same time as and integrated with the gate electrode 13*g* of the light emission drive transistor Tr13 by patterning the gate conductive layer. The gate conductive layer can be patterned by photolithography at a time. In a top emission type, the production process of these members can be simplified. Furthermore, the drive circuit array substrate can be a monocolor substrate.

In the above described embodiment, the explanation is made with the organic EL elements having a three-layer structure consisting of a hole-injection layer, interlayer, and light emission layer. Alternatively, for example, the organic EL elements may have a two-layer structure consisting of a hole-injection layer and light emission layer, a single layer structure in which a light emission layer also serves as a hole-injection layer, or a structure having four or more layers.

In the above described embodiment, the explanation is made with inversely-staggered transistors. Alternatively, the transistors can be of a coplanar type.

Figure 8:
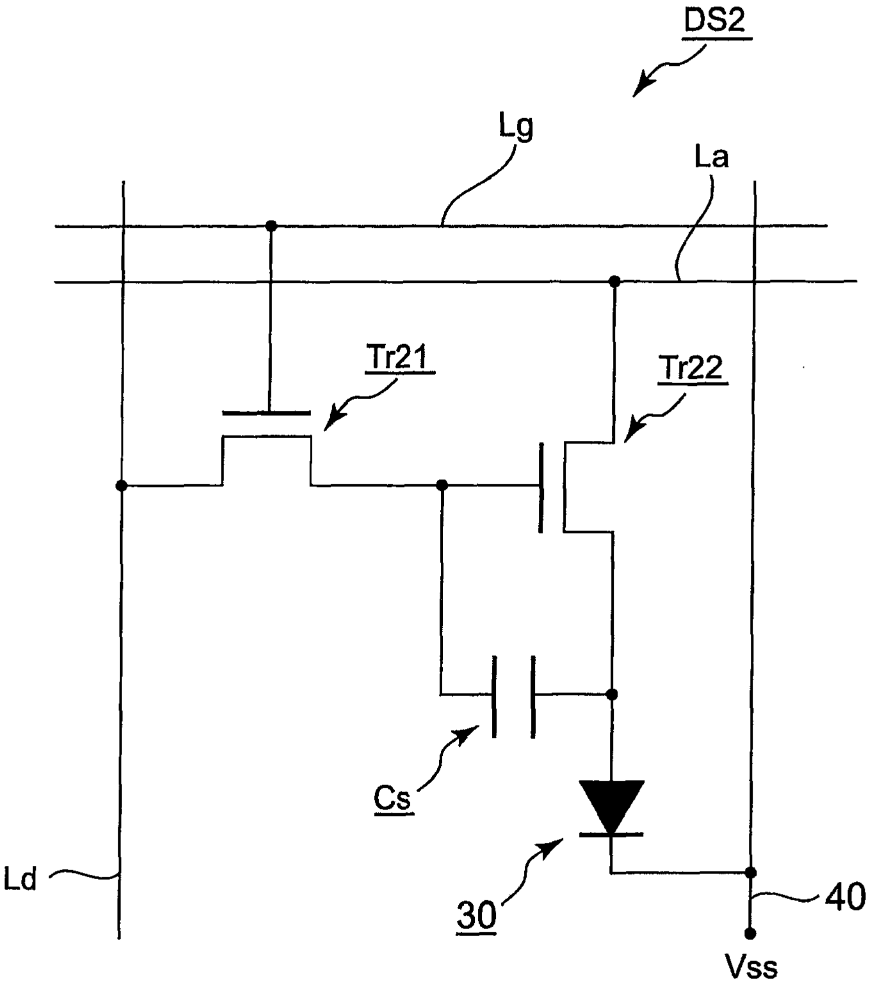
FIG. 8 is an illustration showing a modified embodiment of the optical element drive circuit.

In the above described embodiment, the explanation is made with the lighting circuit having three transistors for making the organic EL elements emit light. Alternatively, the lighting circuit may have two transistors as shown in FIG. 8 or four or more transistors.

In the above described embodiment, the data voltage application circuit 15, data selection circuit 16, and gate selection circuit 17 are cut off before the mounting. It is unnecessary to cut off them where these circuits do not affect the finished drive circuit array substrate.

Having described and illustrated the principles of this application by reference to one (or more) preferred embodiment(s), it should be apparent that the preferred embodiment may be modified in arrangement and detail without departing from the principles disclosed herein and that it is intended that the application be construed as including all such modifications and variations insofar as they come within the spirit and scope of the subject matter disclosed herein.

What is claimed is:

1. A drive circuit array substrate comprising:

a plurality of control signal wires formed on a substrate and extending in a first direction;

a plurality of gradation signal wires formed on the substrate and extending in a second direction that is different from the first direction;

a plurality of pixels formed on the substrate and arranged near intersections of the control signal wires and the gradation signal wires; and a drive element test circuit formed on the substrate, wherein each of the pixels includes a drive circuit, wherein the drive circuit includes a drive element and a selection element, wherein one end of a current path of the selection element is connected to one end of a current path of the drive element, and the other end of the current path of the selection element is connected to the gradation signal wire;

wherein the drive element test circuit includes a plurality of test wires respectively connected to the gradation signal wires, a feeder wire to which an external circuit having a voltage source or a current source is connected, a plurality of read switches each having a current path connected to the test wire at one end and connected to the feeder wire at the other end, and a test wire selection circuit selecting the read switches in sequence; and wherein the feeder wire allows a current to run through the current path of the drive element from the external circuit via the selected read switch, the test wire, and the gradation signal wire when the feeder wire is connected to the external circuit.

2. The drive circuit array substrate according to claim 1, further comprising a control signal supply circuit connected to the control signal wires and supplying control signals to the selection elements.

3. The drive circuit array substrate according to claim 1, wherein:

the pixels further comprise a light emitting element which emits light when the drive element is driven;

the drive circuit array substrate further comprises a light emitting element test circuit formed on the substrate;

the light emitting element test circuit comprises a plurality of first wires respectively connected to the gradation signal wires, a plurality of second wires connected to an external voltage source or connected to an external current source, a plurality of third wires connected to an external voltage source, and an output control switch formed in a same step as the drive element, the selection element of the drive circuit, and the read switches, and wherein a current path of the output control switch is connected to the first wire at one end and connected to the second wire at the other end;

the second wire allows a current to run through the current path of the drive element from an external voltage source or from an external current source via the output control switch, the test wire, and the gradation signal wire so that the light emitting element emits light when the second wire is connected to the external voltage source or connected to the external current source, and the third wire is connected to the external voltage source.

4. The drive circuit array substrate according to claim 3, wherein the second wire and the third wire are provided for each emitted light color of the light emitting element.

5. A drive circuit array substrate comprising:

a plurality of control signal wires formed on a substrate and extending in a first direction;

a plurality of gradation signal wires formed on the substrate and extending in a second direction that is different from the first direction;

a plurality of pixels formed on the substrate, each pixel having (i) a drive circuit having a drive element and a selection element, a current path of the selection element being connected to the gradation signal wire at one end and connected to a gate of the drive element at the other end, and (ii) a light emitting element which emits light when the drive element is driven, wherein the pixels are arranged near intersections between the control signal wires and the gradation signal wires;

a drive element test circuit formed on the substrate; and a light emitting element test circuit formed on the substrate;

wherein:

the drive element test circuit includes a plurality of test wires respectively connected to a plurality of gradation signal wires, a feeder wire to which an external circuit having a voltage source or a current source is connected, a plurality of read switches each having a current path connected to the test wire at one end and connected to the feeder wire at the other end, and a test wire selection circuit selecting the read switches in sequence;

the light emitting element test circuit has a plurality of first wires respectively connected to the gradation signal wires, a plurality of second wires connected to an external voltage source or connected to an external current source, a plurality of third wires connected to an external voltage source, and an output control switch a current path of which is connected to the first wire at one end and connected to the second wire at the other end;

when the feeder wire is connected to the external circuit, a current is allowed to run through the current path of the drive element via the feeder wire, the selected read switch, the test wire, and the gradation signal wire; and when the second wire is connected to an external voltage source or connected to an external current source and the third wire is connected to an external voltage source, a current is allowed to run through the current path of the drive element via the second wire, the output control switch, the test wire, and the gradation signal wire so that the light emitting element emits light.

6. The drive circuit array substrate according to claim 5, further comprising a control signal supply circuit connected to the control signal wires and supplying control signals to the selection elements.

7. A method of testing a drive circuit array substrate, wherein the drive circuit array substrate comprises:

a plurality of control signal wires formed on the substrate and extending in a first direction;

a plurality of gradation signal wires formed on the substrate and extending in a second direction that is different from the first direction;

a plurality of pixels formed on the substrate and arranged near intersections between the control signal wires and the gradation signal wires; and a drive element test circuit formed on the substrate, wherein each of the pixels has a drive circuit having a drive element and a selection element, a current path of the selection element being connected to one end of a current path of the drive element at one end and connected to the gradation signal wire at the other end; and wherein the drive element test circuit has a plurality of test wires respectively connected to the gradation signal wires, a feeder wire to which an external circuit having a voltage source or a current source and a voltmeter or an ammeter is connected, a plurality of read switches each having a current path connected to the test wire at one end and connected to the feeder wire at the other end, and a test wire selection circuit selecting the read switches in sequence; and wherein the method comprises:

a step of running a current through the current path of the drive element via the feeder wire, the selected read switch, the test wire, and the gradation signal wire when the feeder wire is connected to the external circuit; and a drive test step of measuring element characteristics of the drive element either by supplying a voltage to the test wire and measuring the voltage value or by supplying a current to the test wire and measuring the voltage value so as to test the drive of the drive circuit.

8. The method according to claim 7, wherein:

the pixels further comprise a light emitting element which emits light when the drive element is driven;

the drive circuit array substrate further comprises a light emission test circuit formed on the substrate;

the light emitting element test circuit has a plurality of first wires respectively connected to a plurality of gradation signal wires, a second wire connected to an external voltage source or connected to an external current source, a third wire connected to an external voltage source, and an output control switch formed in a same step as the drive element, the selection element of the drive circuit, and the read switches, and wherein the current path of the output control switch is connected to the first wire at one end and connected to the second wire at the other end; and the method further includes a light emission test step in which when the second wire is connected to an external voltage source or connected an external current source and the third wire is connected to an external voltage source, the second wire allows a current to run through the current path of the drive element from the external voltage source or from the external current source via the output control switch, test wire, and the gradation signal wire so that the light emitting element emits light so as to examine whether an intended light emitting element emits light normally.

9. The method according to claim 8, wherein:

the second wire and the third wire are provided for each emitted light color of the light emitting element; and the light emission test step includes a test item of selecting the second wire and the third wire corresponding to each emitted light color and testing the light emitting elements by making the light emitting elements emit light at each intended color light.

10. The method according to claim 8, wherein the light emission test step includes a test item of making the light emitting elements emit light in a high temperature environment.

* * * * *